(12) United States Patent
Mishima et al.

(10) Patent No.: US 7,202,161 B2
(45) Date of Patent: Apr. 10, 2007

(54) SUBSTRATE PROCESSING METHOD AND APPARATUS

(75) Inventors: Koji Mishima, Tokyo (JP); Kanda Hiroyuki, Tokyo (JP); Suzuki Hidenao, Tokyo (JP); Tokushige Katsuhiko, Tokyo (JP); Nagano Hidekazu, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/853,130

(22) Filed: May 26, 2004

(65) Prior Publication Data

US 2004/0241985 A1   Dec. 2, 2004

(30) Foreign Application Priority Data

May 26, 2003   (JP)   ............................. 2003-148326

(51) Int. Cl.
   *H01L 21/461*   (2006.01)
(52) U.S. Cl. ...................... 438/633; 438/692
(58) Field of Classification Search .................... 438/7, 438/8, 633, 645, 690, 691, 692; 204/204 M, 204/230.2
   See application file for complete search history.

(56) References Cited

U.S. PATENT DOCUMENTS

| | | | |
|---|---|---|---|
| 5,948,203 A  * | 9/1999 | Wang ..................... 156/345.13 |
| 6,176,992 B1 | 1/2001 | Talieh .......................... 205/87 |
| 6,299,741 B1 * | 10/2001 | Sun et al. .............. 204/224 M |
| 6,709,979 B2 * | 3/2004 | Komai et al. ............... 438/678 |
| 6,736,699 B2 * | 5/2004 | Nogami et al. ................ 451/5 |
| 6,739,951 B2 * | 5/2004 | Sun et al. ..................... 451/41 |
| 6,790,763 B2 * | 9/2004 | Kondo et al. ............... 438/622 |
| 6,921,712 B2 * | 7/2005 | Soininen et al. ............ 438/597 |
| 2002/0088543 A1 * | 7/2002 | Ashjaee et al. ........ 156/345.31 |
| 2003/0032373 A1 * | 2/2003 | Basol et al. ................... 451/41 |
| 2004/0132381 A1 * | 7/2004 | Basol et al. .................... 451/5 |
| 2004/0259365 A1 * | 12/2004 | Komai et al. ............... 438/691 |

* cited by examiner

*Primary Examiner*—Lex H. Malsawma
(74) *Attorney, Agent, or Firm*—Wenderoth, Lind & Ponack L.L.P.

(57) ABSTRACT

There is provided a substrate processing method which, even when a material having a low mechanical strength is employed as an interlayer dielectric, can produce a semiconductor device having a multi-layer interconnect structure of fine interconnects in higher yield. A substrate processing method according to the present invention includes steps of: providing a substrate having interconnect recesses formed in a surface; forming a metal film on the surface of the substrate by plating to embed the metal film in the interconnect recesses; removing the metal film formed in an ineffective region of the substrate and an extra metal film formed in an effective region of the substrate; and flattening the surface of the substrate after removal of the metal film by performing chemical-mechanical polishing.

8 Claims, 28 Drawing Sheets

SUBSTRATE PROCESSING METHOD AND APPARATUS

BACKGROUND OF THE INVENTION

1. Field of the Invention

The present invention relates to a substrate processing method and apparatus, and more particularly to a substrate processing method and apparatus which is useful, for example, in the fields of LSI, displays and magnetic heads, and in the field of chip mounting thereof, for forming a metal film (interconnect material), such as a copper film, by plating a surface of a substrate having fine interconnect recesses (interconnect patterns) formed therein, and removing an extra metal film, thereby forming metal interconnects of a submicron to micron size.

2. Description of the Related Art

In recent years, instead of using aluminum or aluminum alloys as an interconnect material for forming electrical interconnects on a semiconductor substrate, there has been an eminent movement toward using copper (Cu) which has a low electric resistivity and high electromigration resistance. It is generally difficult with copper to form interconnects by anisotropic etching as practiced with aluminum. Accordingly, copper interconnects are generally formed by a so-called copper damascene technique, which comprises embedding of copper in fine recesses formed in a surface of a substrate. Known methods for forming such copper interconnects include CVD, sputtering and plating. According to any such method, a copper film is formed on almost an entire surface of a substrate, followed by removal of unnecessary copper by performing chemical-mechanical polishing (CMP).

FIGS. 1A through 1C illustrate, in sequence of process steps, a process for producing a substrate W having such copper interconnects, and FIG. 2 is a flow chart of the process. First, as shown in FIG. 1A, an insulating film (interlayer dielectric) 2, for example, an oxide film of $SiO_2$ or a film of a low-k material, is deposited on a conductive layer 1a in which semiconductor devices are formed and which is formed on a semiconductor base 1. Fine interconnect recesses, such as fine holes (via holes) 3 and interconnect trenches 4, are formed in the insulating film 2 by performing a lithography/etching technique. Thereafter, a barrier layer 5 of TaN or the like is formed on an entire surface of the insulating film 2, and a seed layer 7, serving as an electric feeding layer during electroplating, is formed on the barrier layer 5. A substrate W having fine interconnect recesses formed in a surface thereof is thus prepared.

Then, as shown in FIG. 1B, copper plating of the surface of the substrate W is performed to fill the fine holes 3 and the interconnect trenches 4 with copper and, at the same time, deposit a copper film 6 on the insulating film 2 (step 1). At this stage, the copper film 6 is deposited on an entire surface of the substrate W including, besides a device-formation-region, an edge (bevel) portion which is an ineffective region. Further, a copper film can inevitably be formed on a back surface of the substrate W. Accordingly, the copper film deposited in the ineffective region, i.e. the edge (bevel) portion, of the substrate is removed, for example by etching, followed by cleaning and, if necessary, the back surface of the substrate is also cleaned (step 2). Further, according to necessity, the substrate W is subjected to annealing (heating) or infrared irradiation to grow and stabilize metal crystals of the copper film 6 (step 3).

Next, an extra or unnecessary copper film 6 and the barrier layer 5 on the insulating film 2 are removed by chemical-mechanical polishing (CMP) so as to make a surface of the copper film 6, filled in the fine holes 3 and the interconnect trenches 4, substantially flush with a surface of the insulating film 2. Interconnects, which are formed of the copper film 6, as shown in FIG. 1C, are thus formed (step 4). Front and back surfaces of the substrate, having the interconnects of copper film 6, are cleaned by using a combined chemical and physical means, for example a combination of a chemical and scrubbing, and rinsed (cleaned) with pure water, followed by spin-drying (step 5). The substrate after drying is then sent to a next process.

The above-described crystal stabilization processing is generally performed by heating the substrate in an inert gas atmosphere. In some cases, however, it is effective to allow the substrate to stand at room temperature to effect spontaneous annealing (step 3), as shown in FIG. 3.

FIG. 4 schematically shows a conventional common plating apparatus including a plating unit for performing the above-described plating, and a removal unit, for example comprised of a bevel etching/back surface cleaning unit, for performing the above-described removal of a metal film (copper film) in the ineffective region of a substrate and cleaning of the substrate. This plating apparatus 10 includes a rectangular apparatus frame 14 and transport boxes 12, detachably mounted to the apparatus frame 14, each housing substrates, e.g. substrates W having a seed layer 7, shown in FIG. 1A. Inside the apparatus frame 14 are disposed a stage 16, four plating units 18, two bevel etching/back surface cleaning units (removal units) 20, and two transport robots 22, 24 as transport devices.

According to the plating apparatus 10, substrates, e.g. the substrates W having a seed layer 7, are carried one by one by the transport robot 22 from a corresponding transport box 12 into the apparatus frame 14, and each substrate is transported to one of the plating units 18, where the substrate is plated. The substrate after plating is transported to one of the bevel etching/back surface cleaning units 20, where removal, by etching, of e.g. a copper film deposited in an ineffective region of the substrate and subsequent cleaning and, according to necessity, cleaning of a back surface of the substrate are performed, followed by drying. Thereafter, the substrate is returned by the transport robot 22 to an original position in the transport box 12.

FIG. 5 schematically shows a conventional common annealing apparatus (crystal stabilization apparatus) having an annealing unit (crystal stabilization unit) for performing crystal stabilization processing of a metal film by the above-described annealing (heating). This annealing apparatus 26 includes a rectangular apparatus frame 28 and transport boxes 12, detachably mounted to the apparatus frame 28, each housing substrates, e.g. substrates having a copper film 6 which has been deposited by the above plating apparatus 10, such as shown in FIG. 1B. Inside the apparatus frame 28 are disposed two annealing units 30 and a transport robot 32 as a transport device.

According to the annealing apparatus 26, the substrates after plating, for example, are carried one by one by the transport robot 32 from a corresponding transport box 12 into the apparatus frame 28, and each substrate is transported to one of the annealing units 30, where the substrate is subjected to annealing. The substrate after annealing is returned by the transport robot 32 to an original position in the transport box 12.

FIG. 6 schematically shows a conventional common CMP apparatus having a CMP unit for performing the above-described chemical-mechanical polishing (CMP). This CMP apparatus 34 includes a rectangular apparatus frame 36 and transport boxes 12, detachably mounted to the apparatus frame 36, each housing e.g. substrates which have been annealed in the above annealing apparatus 26. Inside the apparatus frame 36 are disposed two CMP units 46, each including a top ring 38, a turntable (polishing table) 40, a dresser 42 and a loader 44, for polishing a substrate by pressing the substrate held by the top ring 38 against a polishing surface (upper surface) of the turntable 40 while moving the substrate and the turntable 40 relative to each other. There are also disposed two stages 48, two scrub cleaning units 50 for performing scrub cleaning, two cleaning/drying units 52 for performing rinsing (cleaning) with pure water and spin-drying, and three transport robots 54, 56, 58 as transport devices inside the apparatus frame 36.

According to the CMP apparatus 34, the substrates after annealing are carried one by one by the transport robot 54 from a corresponding transport box 12 into the apparatus frame 36, and each substrate is transported to one of the CMP units 46, where the substrate is subjected to chemical-mechanical polishing (CMP). The substrate after CMP is transported to one of the scrub cleaning units 50 for scrub cleaning of the substrate, and this cleaned substrate is transported to one of the cleaning/drying units 52 for rinsing with pure water and spin-drying of the substrate. Thereafter, the substrate is returned by the transport robot 54 to an original position in the transport box 12.

A composite apparatus 60 which combines the above-described plating apparatus 10 and annealing apparatus 26, as shown in FIG. 7, is known. As shown in FIG. 7, annealing unit 30 is provided beside the above-described plating apparatus 10 and they communicate with each other through a passage 62, so that after plating and a subsequent bevel etching/back surface cleaning of a substrate, annealing of the substrate can be performed.

For formation of metal interconnects in e.g. an LSI, it is a conventional practice to employ the above-described plating apparatus 10, annealing apparatus 26, CMP apparatus 34, and the like in a proper combination. With progress toward finer metal interconnects and emergence of new interlayer dielectric materials, many unexpected technical problems have arisen. Such technical problems have not surfaced in conventional interconnect formation processes which use, as interlayer dielectric materials, existing materials such as $SiO_2$, SiOF, SiOC, SiLK, and the like. The following is a description of the technical problems.

Porous materials (porous low-k materials), which have a lower dielectric constant k than conventional insulating materials, are attracting attention as promising next-generation interlayer dielectric materials. Such materials, because of their internal porous structure, generally have lower mechanical strength and thus are weaker than the conventional interlayer dielectric materials. Use of such a porous material can cause peel-off or separation of an interlayer dielectric or copper interconnects during chemical-mechanical polishing (CMP), leading to an interconnect breakage or a short circuit. Many factors may be involved in these problems or drawbacks, such as a shortage of mechanical strength of the interlayer dielectric itself, poor adhesion at an interface between an insulating film and a different material, interfacial peeling caused by a difference in expansion/contraction upon a thermal change between different materials, for example, a porous low-k material and a metal, and the like.

In order to solve or minimize the problems, it is most desirable to provide a low-k material with enhanced strength. Other approaches are directed to technical improvements, such as lowering of stress applied to a substrate in a chemical-mechanical polishing process (e.g. low-load polishing), reduction of an expansion/contraction difference between materials in a metal crystal stabilization process, minimization of a thickness of a plated film in a plating process, reduction of a level difference after plating, and the like. These approaches, however, have their own difficult problems that would take a long time to solve.

SUMMARY OF THE INVENTION

The present invention has been made in view of the above situation in the related art. It is therefore an object of the present invention to provide a substrate processing method and apparatus which, even when a material having a low mechanical strength is employed as an interlayer dielectric, can produce a semiconductor device having a multi-layer interconnect structure of fine interconnects in higher yield.

In order to achieve the above object, the present invention provides a substrate processing method comprising steps of: providing a substrate having interconnect recesses formed in a surface thereof; forming a metal film on the surface of the substrate by plating to embed the metal film in the interconnect recesses; removing the metal film formed in an ineffective region of the substrate and an extra metal film formed in an effective region of the substrate; and flattening a surface of the substrate after removal of the metal film by performing chemical-mechanical polishing.

According to this method, in advance of chemical-mechanical polishing which is likely to cause damage to a substrate, a metal film formed in excess in the effective region of the substrate is made thin. This reduces a stress to interconnects due to an expansion/contraction difference. Further, polishing time itself can be minimized. Accordingly, peel-off or separation of an interlayer dielectric and interconnects can be prevented even when a material having a low mechanical strength is employed for the interlayer dielectric.

The present invention also provides a substrate processing method comprising steps of: providing a substrate having interconnect recesses formed in a surface thereof; forming a metal film on the surface of the substrate by plating to embed the metal film in the interconnect recesses; removing the metal film formed in an ineffective region of the substrate and an extra metal film formed in an effective region of the substrate; cleaning the substrate after the removal of the metal film; subjecting the substrate after the cleaning to crystal stabilization processing to stabilize metal crystals of the metal film; and flattening a surface of the substrate after the crystal stabilization processing by performing chemical-mechanical polishing.

This method includes a step of stabilizing the metal crystals of the metal film, for example, by annealing. According to this method, in advance of the crystal stabilization processing (annealing) step, the metal film formed in excess in the effective region of the substrate is made thin, thereby reducing a stress to interconnects due to an expansion/contraction difference. Further, a time required for stabilization of the metal crystals can be minimized.

In a preferred embodiment of the present invention, removal of the extra metal film formed in the effective region of the substrate is a partial removal for removing part of the extra metal film, and a thickness of a remaining metal film is measured to control a removal amount of the metal film.

By measuring the thickness of the metal film remaining in the effective region of the substrate during this metal film removal step and feeding back this measured thickness, the removal amount of the metal film can be controlled in situ.

The metal film may be a copper, copper alloy, silver or silver alloy film.

The present invention may be used primarily in the field of LSI. In that field, copper, a copper alloy, silver or a silver alloy is primarily used as an interconnect material for fine interconnects. The metal film, of course, is not limited to these metals.

In a preferred embodiment of the present invention, removal of the extra metal film formed in the effective region of the substrate is performed by chemical etching, electrolytic etching or composite electrolytic polishing.

Chemical agents commonly used in chemical etching include hydrogen peroxide, ozone, and the like as oxidizing agents and sulfuric acid, hydrochloric acid, hydrofluoric acid and other chelating agents as metal removal agents. It is possible to oxidize a surface of a metal film with ultraviolet rays. Electrolytic etching is performed by utilizing a metal film formed on a substrate as an anode, and immersing the metal film in an electrolytic solution such that the metal film faces an anode disposed in the electrolytic solution and passing an electric current between the anode and the cathode, thereby oxidizing and ionizing and thereby removing the metal film. Composite electrolytic polishing is a polishing method which comprises oxidizing and chelating (complexing) a surface of a metal film in an electrolytic solution to thereby make the metal film surface weak or fragile, and scrub-removing fragile metal film by bringing the metal film into mechanical contact with a contact member. For chelation of metal film, a chelating agent is added to the electrolytic solution. The electrolytic solution may be exemplified by an electrolytic solution containing an electrolyte, such as copper sulfate or ammonium sulfate. It is possible to add abrasive grains or a slurry to the electrolytic solution to enhance a mechanical polishing action.

Removal of the extra metal film formed in the effective region of the substrate may be performed by chemical-mechanical polishing.

The present invention provides a substrate processing apparatus comprising: a plating unit for forming a metal film on a surface of a substrate having interconnect recesses formed therein to embed the metal film in the interconnect recesses; a partial removal unit for removing part of an extra metal film formed in an effective region of the substrate; and a transport device for transporting the substrate between the units.

In a preferred embodiment of the present invention, the partial removal unit is a chemical etching unit, an electrolytic etching unit or a composite electrolytic polishing unit. The partial removal unit may be a chemical-mechanical polishing unit.

The substrate processing apparatus may further comprise a removal unit for removing the metal film formed in an ineffective region of the substrate.

The substrate processing apparatus may further comprise a crystal stabilization unit for stabilizing metal crystals of the metal film remaining on the substrate after partial removal of the extra metal film in the partial removal unit.

The substrate processing apparatus may further comprise a cleaning unit for cleaning the substrate.

The substrate processing apparatus may further comprise a chemical-mechanical polishing unit for removing extra metal film remaining on the substrate after the partial removal of the extra metal film in the partial removal unit, and flattening a surface of the substrate.

The substrate processing apparatus may further comprise a film thickness measuring section for measuring a thickness of the metal film remaining on the substrate after the partial removal of the extra metal film in the partial removal unit, and controlling the partial removal unit based on results of this measurement.

DETAILED DESCRIPTION OF THE PREFERRED EMBODIMENTS

Preferred embodiments of the present invention will now be described with reference to the drawings. The following description illustrates, by way of example, a case of forming copper interconnects on a surface of a substrate.

Figure 8A:
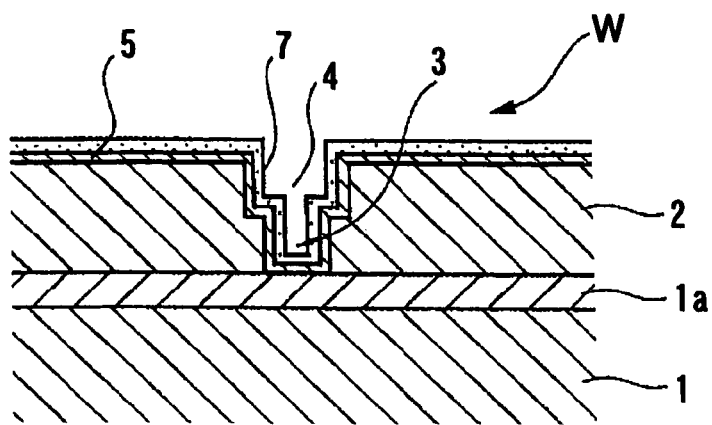
FIGS. 8A through 8D illustrate, in sequence of process steps, formation of copper interconnects by a substrate processing method according to the present invention.
Figure 8B:
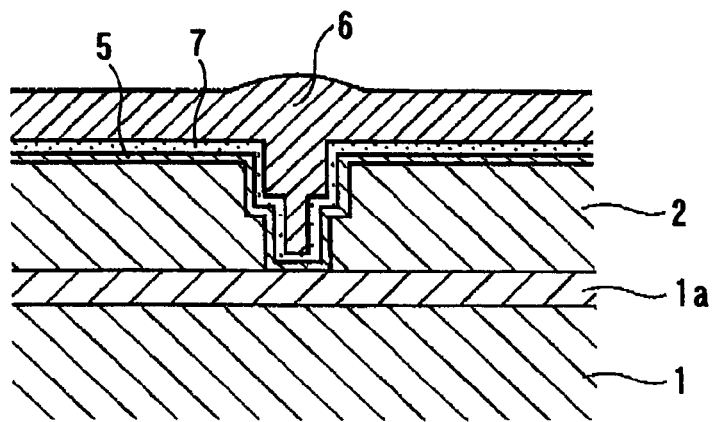
Figure 8C:
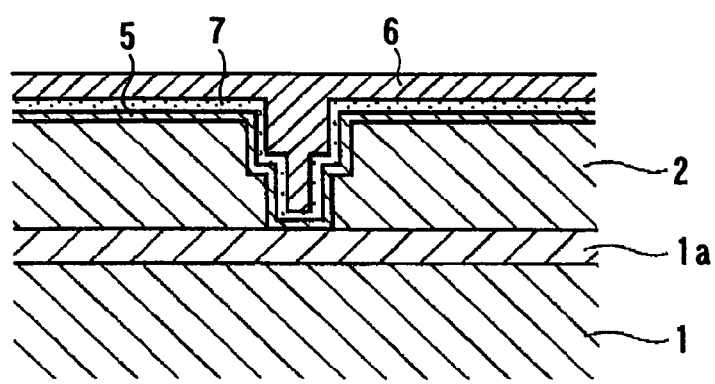
Figure 8D:
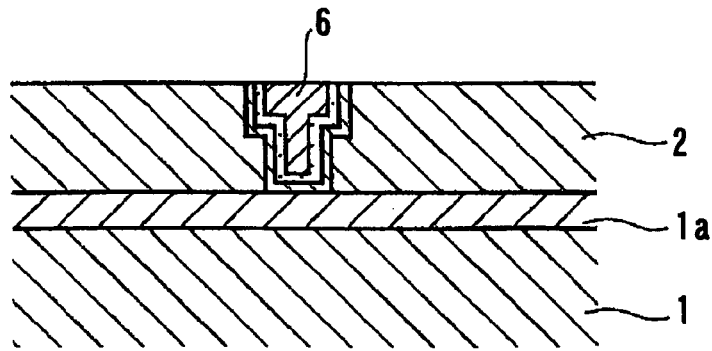
Figure 9:
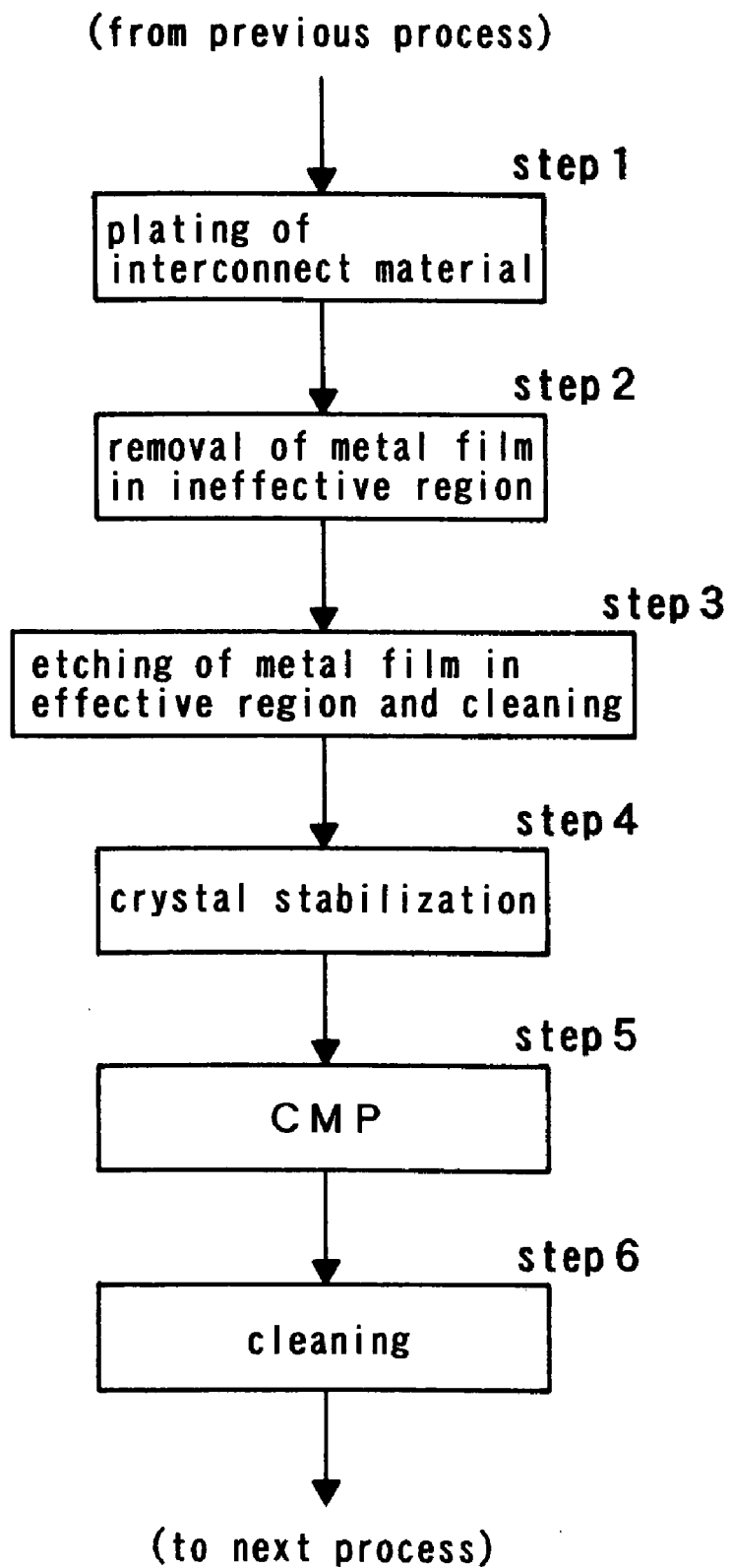
FIG. 9 is a flow chart of a substrate processing method according to an embodiment of the present invention (first method)

FIGS. 8A through 8D illustrate, in sequence of process steps, formation of copper interconnects by a substrate processing method according to the present invention, and FIG. 9 shows a flow chart of a substrate processing method according to an embodiment of the present invention (first method). According to this method, as shown in FIG. 8A, an insulating film (interlayer dielectric) 2, for example, an oxide film of $SiO_2$ or a film of a low-k material, is deposited on a conductive layer 1a in which semiconductor devices are formed and which is formed on a semiconductor base 1. Fine interconnect recesses, such as fine holes (via holes) 3 and interconnect trenches 4, are formed in the insulating film 2 by performing a lithography/etching technique. Thereafter, a barrier layer 5 of TaN or the like is formed on an entire surface of the insulating film 2, and a seed layer 7, serving as an electric feeding layer during electroplating, is formed on the barrier layer 5. A substrate W having fine interconnect recesses formed in a surface is thus prepared.

Then, as shown in FIG. 8B, copper plating of a surface of substrate W is performed to fill the fine holes 3 and the interconnect trenches 4 with copper and, at the same time, deposit a copper film 6 on the insulating film 2 (step 1). At this stage, the copper film 6 is deposited on an entire surface of the substrate W including, besides a device-formation-region, an edge (bevel) portion which is an ineffective region. Further, a copper film can inevitably be formed on a back surface of the substrate W. Accordingly, the copper film deposited in the ineffective region, i.e. the edge (bevel) portion, of the substrate is removed, for example by etching, followed by cleaning and, if necessary, the back surface of the substrate is also cleaned (step 2).

Next, part (surface) of an extra copper film 6 deposited in an effective region, such as the device-formation-region, of the substrate W is removed, for example by chemical etching or electrolytic etching, until the copper film 6 becomes thin to a predetermined thickness, as shown in FIG. 8C, followed by cleaning (step 3). During this partial removal processing, a thickness of remaining copper film 6 is measured and this measured thickness is fed back, whereby a removal amount of copper film 6 can be controlled in-situ. Further, according to necessity, the substrate W is subjected to annealing (heating) or infrared irradiation to grow and stabilize metal crystals of the copper film 6 (step 4).

Next, the extra copper film 6 having the predetermined thickness, remaining on the insulating film 2 positioned in the effective region of the substrate W, and the barrier layer 5 are removed by chemical-mechanical polishing (CMP) so as to make a surface of the copper film 6, filled in the fine holes 3 and the interconnect trenches 4, substantially flush with a surface of the insulating film 2. Interconnects, which are formed of the copper film 6, as shown in FIG. 8D, are thus formed (step 5). Front and back surfaces of the substrate, having the interconnects of copper film 6, are cleaned by using a combined chemical and physical means, for example a combination of a chemical and scrubbing, and rinsed (cleaned) with pure water, followed by spin-drying (step 6). The substrate after drying is then sent to a next process.

Figure 10:
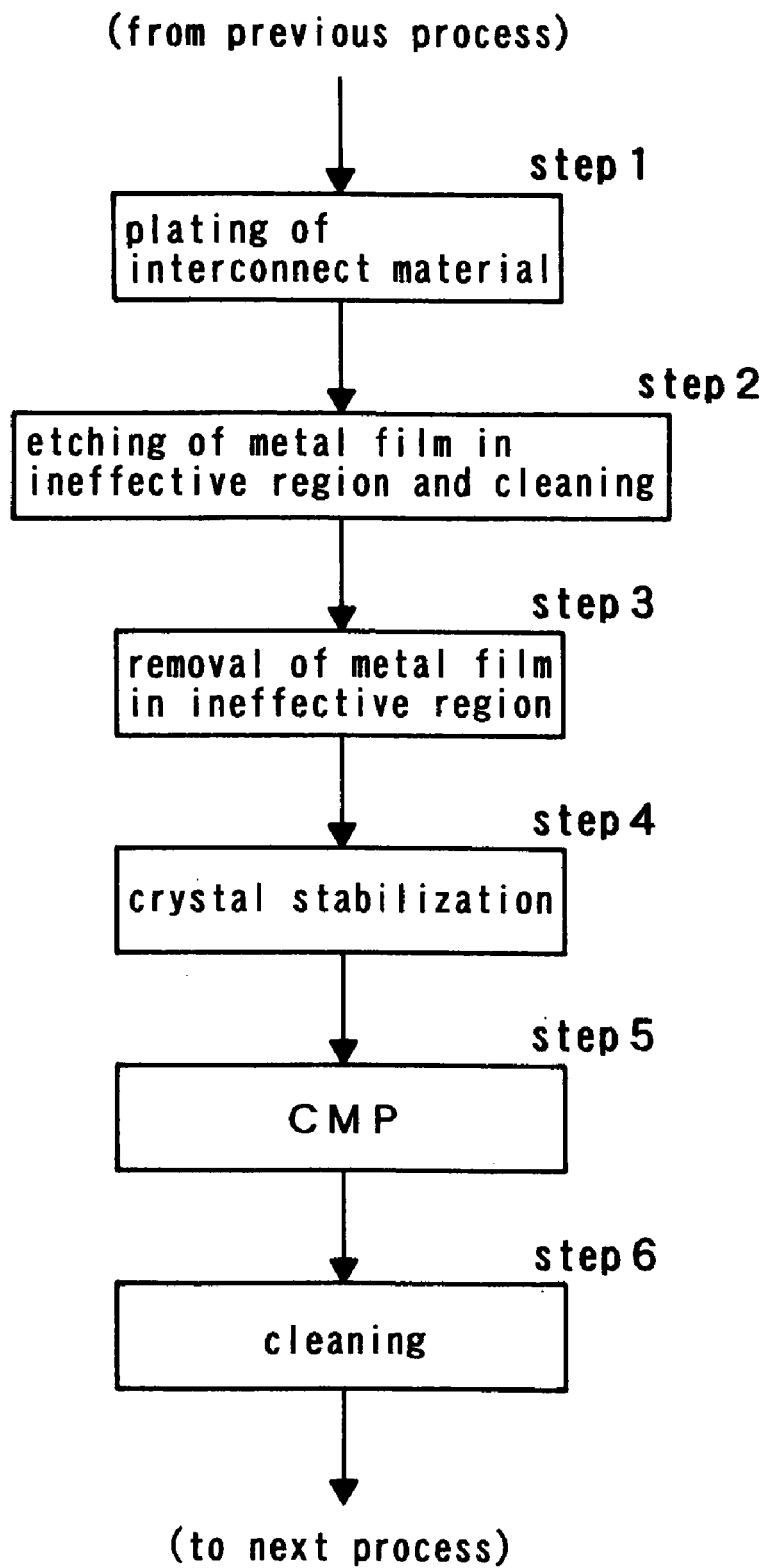
FIG. 10 is a flow chart showing a variation of the first method shown in FIG. 9.

As shown in FIG. 10, it is also possible to first remove part of the extra copper film 6 deposited in the effective region of the substrate W, such as the device-formation-region, followed by cleaning (step 2), and then remove the copper film 6 deposited in the ineffective region of the substrate W, i.e. the edge (bevel) portion, for example by etching, followed by cleaning and, according to necessity, also clean the back surface of the substrate (step 3).

According to this method, in advance of CMP and an optional step for metal crystal stabilization, such as annealing, which steps are likely to cause damage to a substrate, the copper film (metal film) 6 formed in excess in the effective region of the substrate W is made thin. This reduces a stress to interconnects 6 due to an expansion/contraction difference. Further, CMP time and annealing time, themselves, can be minimized. Accordingly, peel-off or separation of the insulating film 2 and the copper interconnects 6 can be prevented even when a material having a low mechanical strength such as a low-k material is employed for the insulating film 2.

Though copper, a copper alloy, silver or a silver alloy is generally employed as a metal interconnect material in the present invention, usable metal interconnect materials, of course, are not limited to these metals. The present invention is particularly effective when a material having a low mechanical strength, such as a porous low-k material, is employed as a material for the insulating film (interlayer dielectric) 2.

Figure 1A:
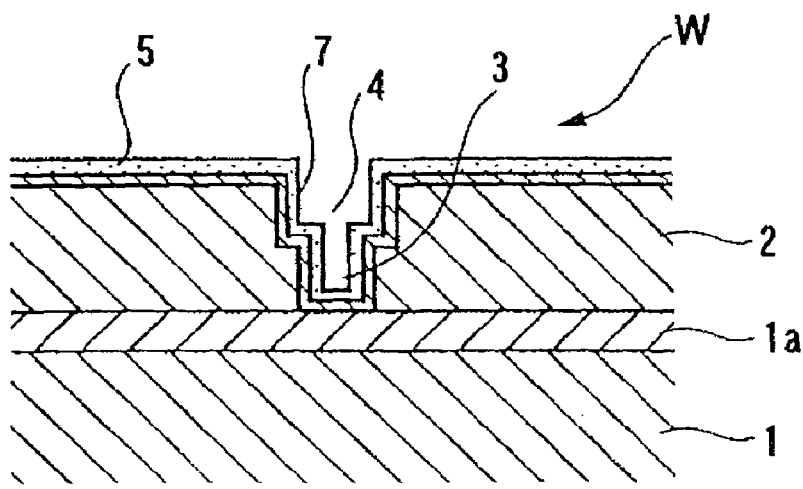
FIGS. 1A through 1C are diagrams illustrating, in sequence of process steps, a conventional process for forming copper interconnects.
Figure 1B:
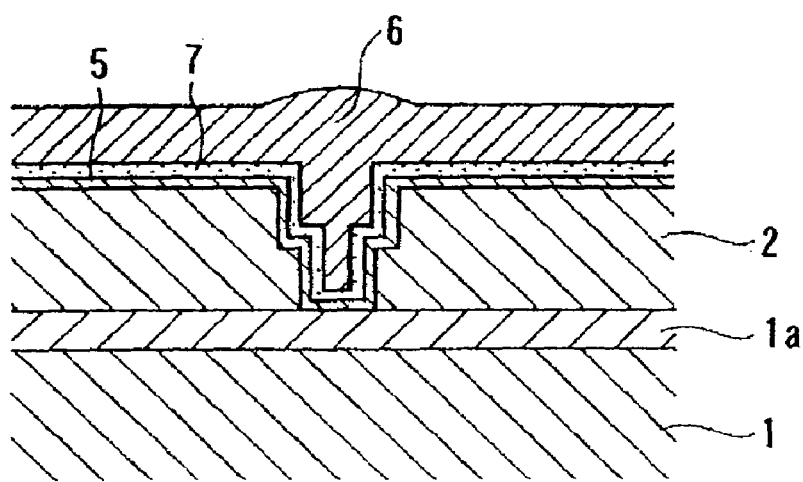
Figure 1C:
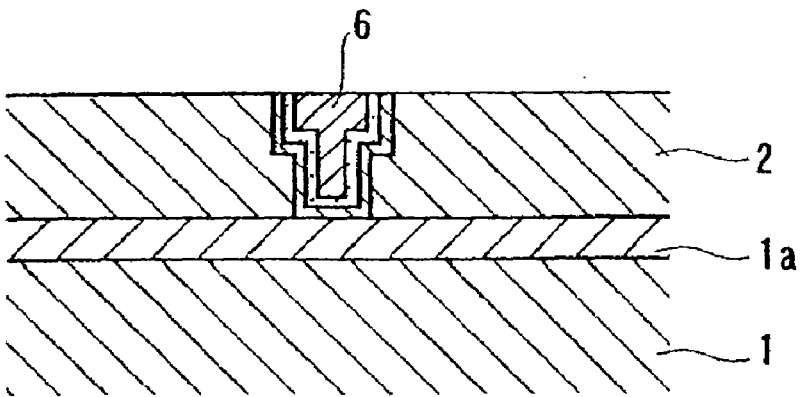
Figure 2:
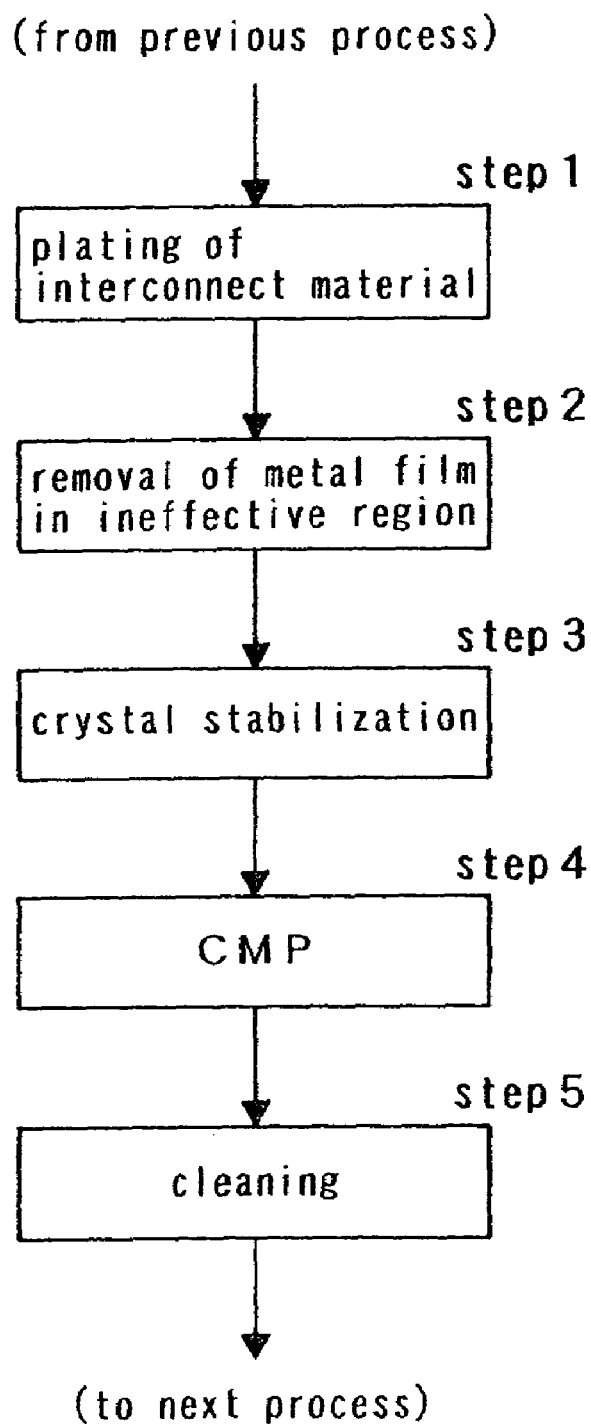
FIG. 2 is a flow chart of a conventional method for forming the copper interconnects shown in FIGS. 1A through 1C.
Figure 3:
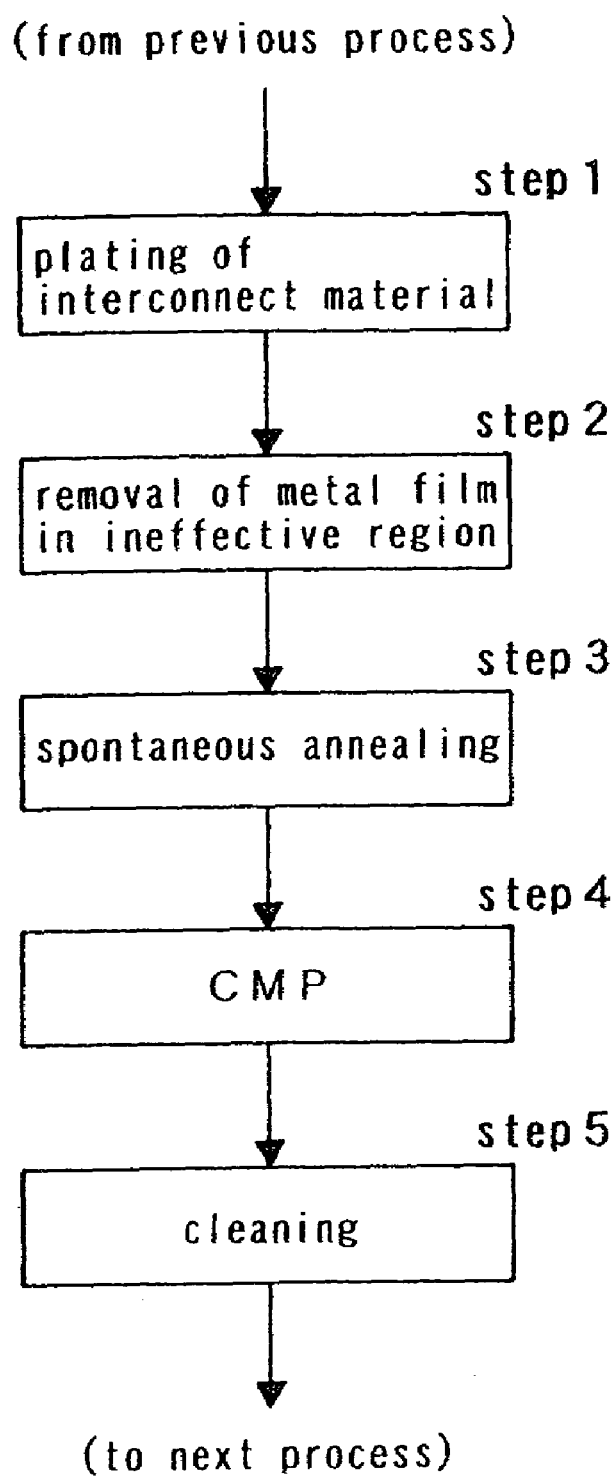
FIG. 3 is a flow chart of another conventional method for forming the copper interconnects shown in FIGS. 1A through 1C.
Figure 4:
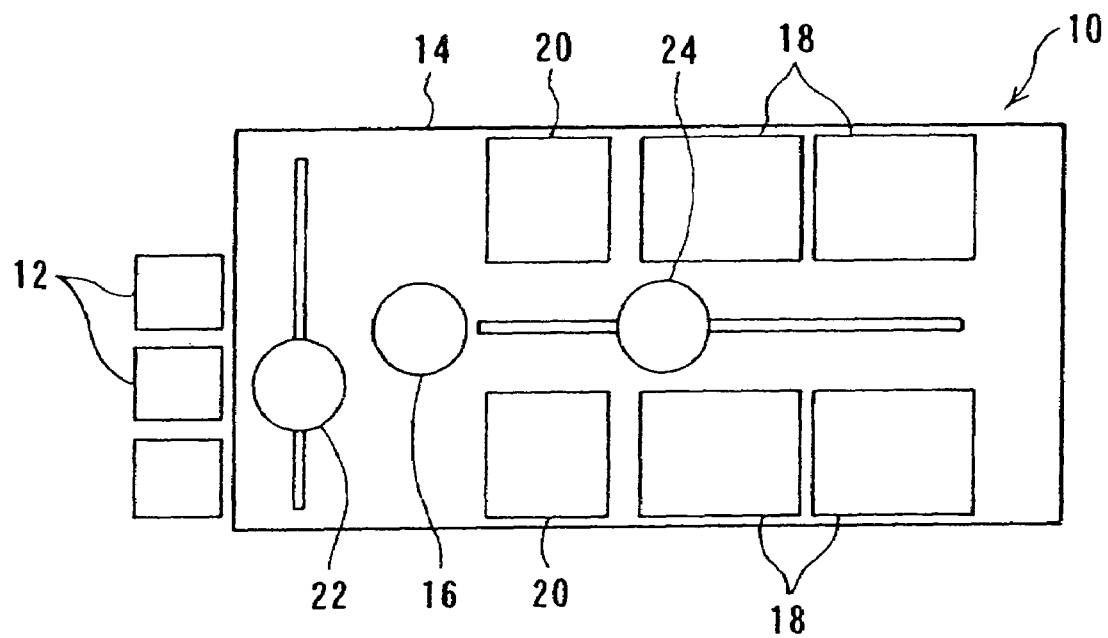
FIG. 4 is a layout plan of a conventional plating apparatus.
Figure 5:
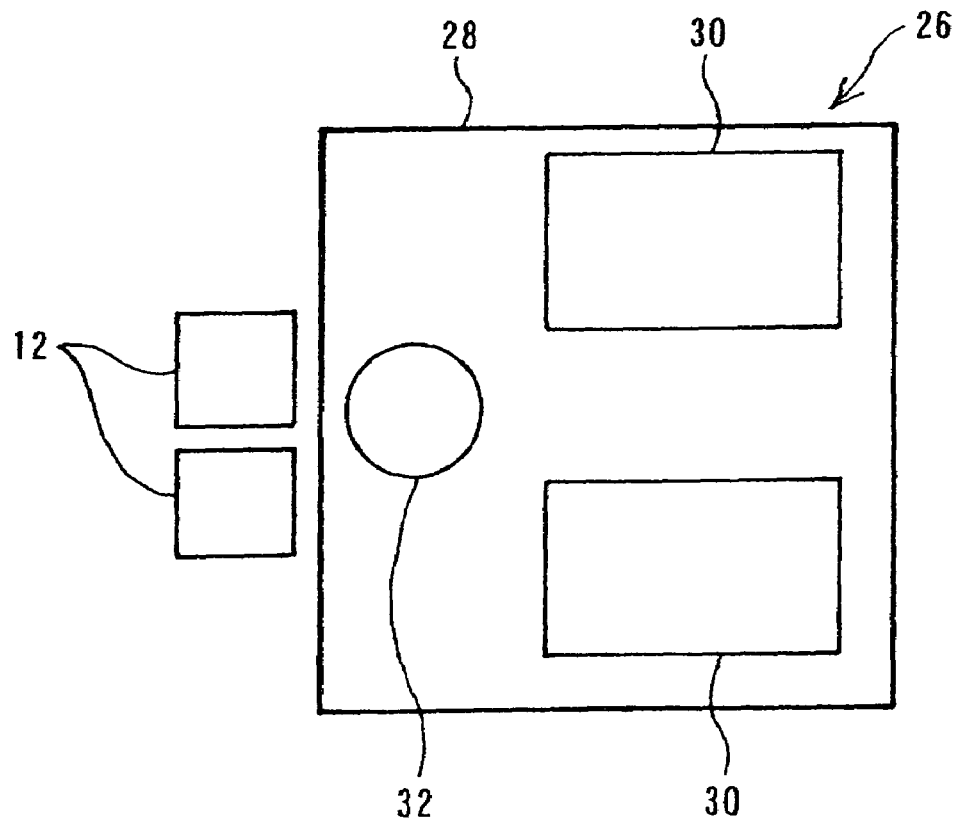
FIG. 5 is a layout plan of a conventional annealing apparatus.
Figure 6:
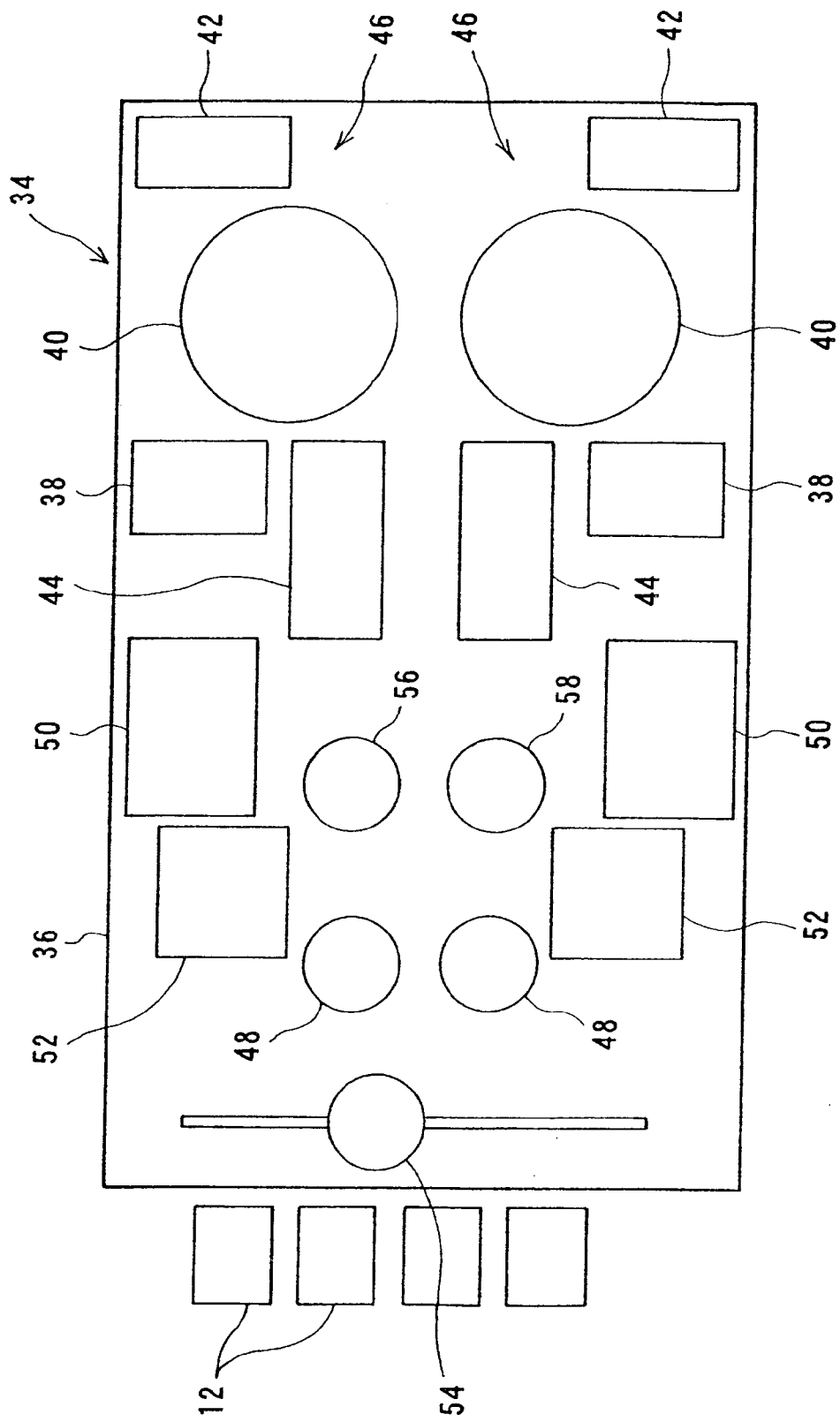
FIG. 6 is a layout plan of a conventional CMP apparatus.
Figure 11:
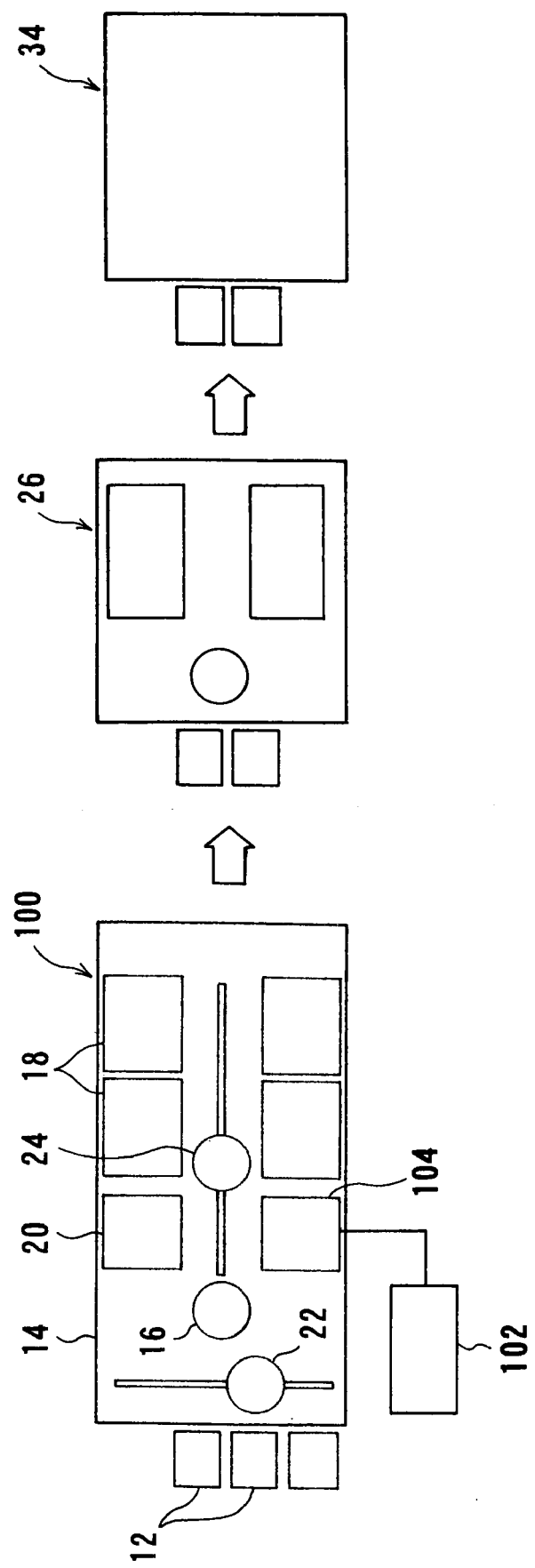
FIG. 11 is a layout plan of a substrate processing apparatus according to an embodiment of the present invention, which is suited for performing the first method.

FIG. 11 shows a substrate processing apparatus according to an embodiment of the present invention, which is suited for performing the above-described first method. The substrate processing apparatus is comprised of a plating apparatus 100, the above-described annealing apparatus 26 shown in FIG. 5, and the above-described CMP apparatus 34 shown in FIG. 6, which are arranged in series. The plating apparatus 100 of this embodiment has a similar construction to the plating apparatus 10 shown in FIG. 4 but employs, in place of one of the two bevel etching/back surface cleaning units 20, a partial removal unit 104, for example comprised of a chemical etching unit or an electrolytic etching unit, provided with a film thickness measuring section 102 for measuring a thickness of a film. The step (step 3) of removing part (surface) of the extra copper film 6 deposited in the effective region of the substrate W, followed by cleaning, is performed by the partial removal unit 104, and a thickness of remaining copper film 6 is measured during this removal processing, with a measuring device of the film thickness measuring section 102, and this measured thickness is fed back so as to control the partial removal unit 104.

Chemical agents commonly used in chemical etching include hydrogen peroxide, ozone, and the like as oxidizing agents and sulfuric acid, hydrochloric acid, hydrofluoric acid and other chelating agents as metal removal agents. It is possible to oxidize a surface of a metal film, such as the copper film 6, with ultraviolet rays. Electrolytic etching is performed by utilizing the copper film 6 formed on the surface of the substrate W as an anode, and immersing the copper film 6 in an electrolytic solution such that the copper film 6 faces an anode disposed in the electrolytic solution, and passing an electric current between the anode and the cathode, thereby oxidizing and ionizing and thereby removing the copper film 6. The measuring device of the film thickness measuring section 102 may be one that utilizes fluorescent X-rays, an eddy current, image analysis, surface reflectivity, and the like.

Figure 7:
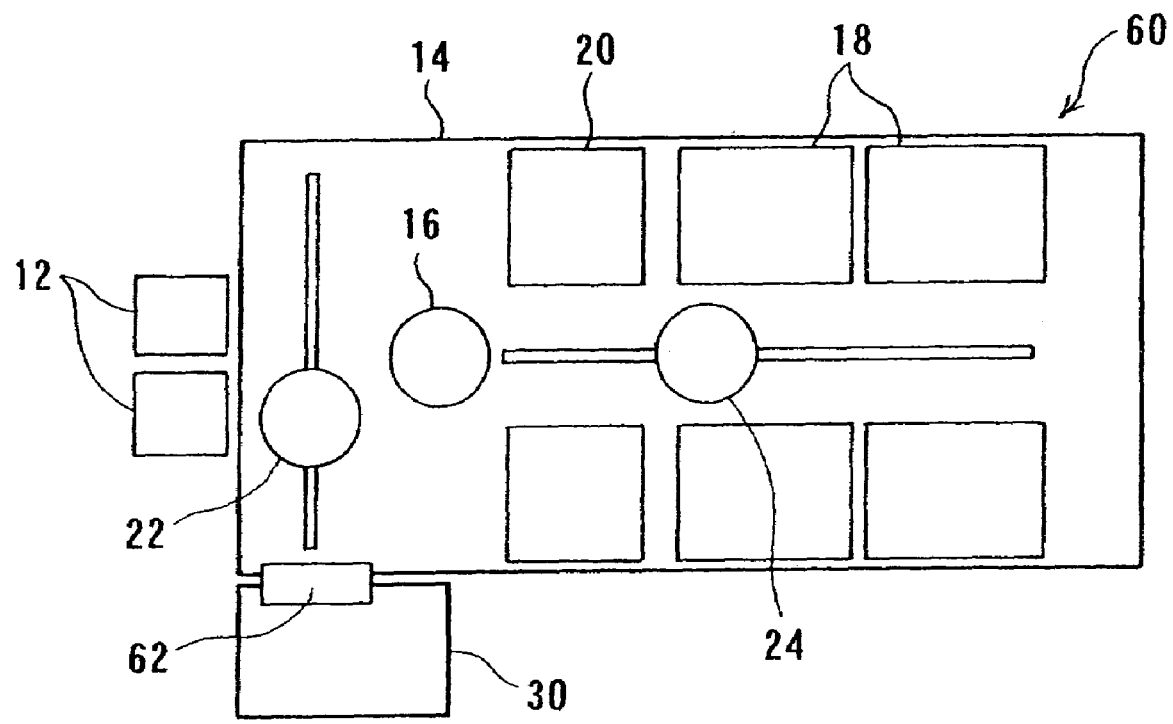
FIG. 7 is a layout plan of a conventional composite apparatus which combines a plating apparatus and an annealing apparatus.
Figure 12:
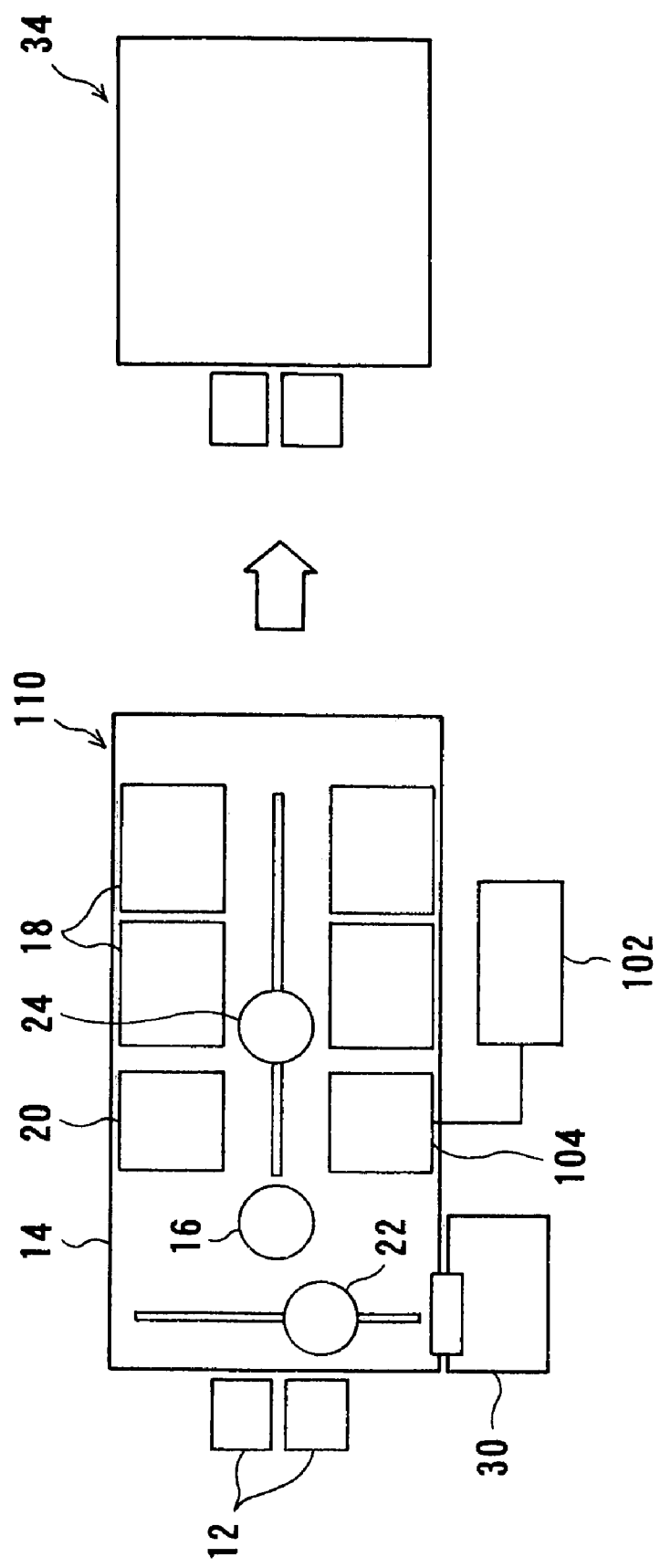
FIG. 12 is a layout plan of a substrate processing apparatus according to another embodiment of the present invention, which is suited for performing the first method.

FIG. 12 shows a substrate processing apparatus according to another embodiment of the present invention, which is suited for performing the above-described first method. This substrate processing apparatus is comprised of a composite apparatus 110 which combines a plating apparatus and an annealing apparatus, and the above-described CMP apparatus 34 shown in FIG. 6, which are arranged in series. The composite apparatus 110 of this embodiment has a similar construction to the composite apparatus 60 shown in FIG. 7 but employs, in place of one of the two bevel etching/back surface cleaning units 20, the partial removal unit 104 shown in FIG. 11, for example comprised of a chemical etching unit or an electrolytic etching unit, provided with film thickness measuring section 102 for measuring a thickness of a film.

Figure 13:
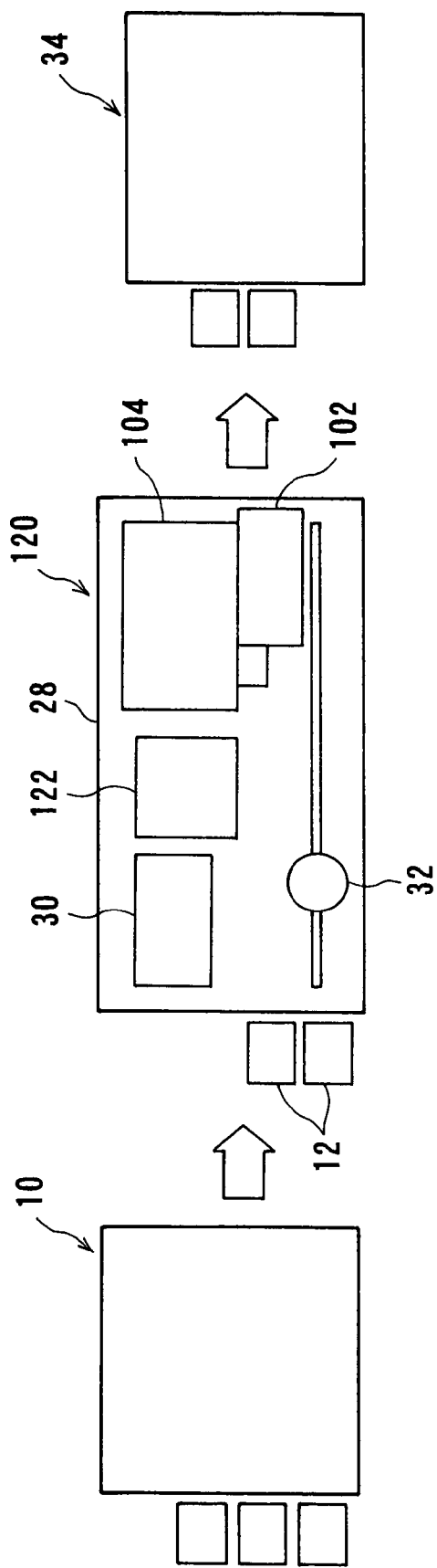
FIG. 13 is a layout plan of a substrate processing apparatus according to yet another embodiment of the present invention, which is suited for performing the first method.

FIG. 13 shows a substrate processing apparatus according to yet another embodiment of the present invention, which is suited for performing the above-described first method. This substrate processing apparatus is comprised of the above-described plating apparatus 10 shown in FIG. 4, an annealing apparatus 120, and the above-described CMP apparatus 34 shown in FIG. 6, which are arranged in series. The annealing apparatus 120 of this embodiment has a similar construction to the annealing apparatus 26 shown in FIG. 5 but additionally includes the partial removal unit 104 shown in FIG. 11, for example comprised of a chemical etching unit or an electrolytic etching unit, provided with film thickness measuring section 102 for measuring a thickness of a film, and a cleaning unit 122 disposed between annealing unit 30 and the partial removal unit 104.

Figure 14:
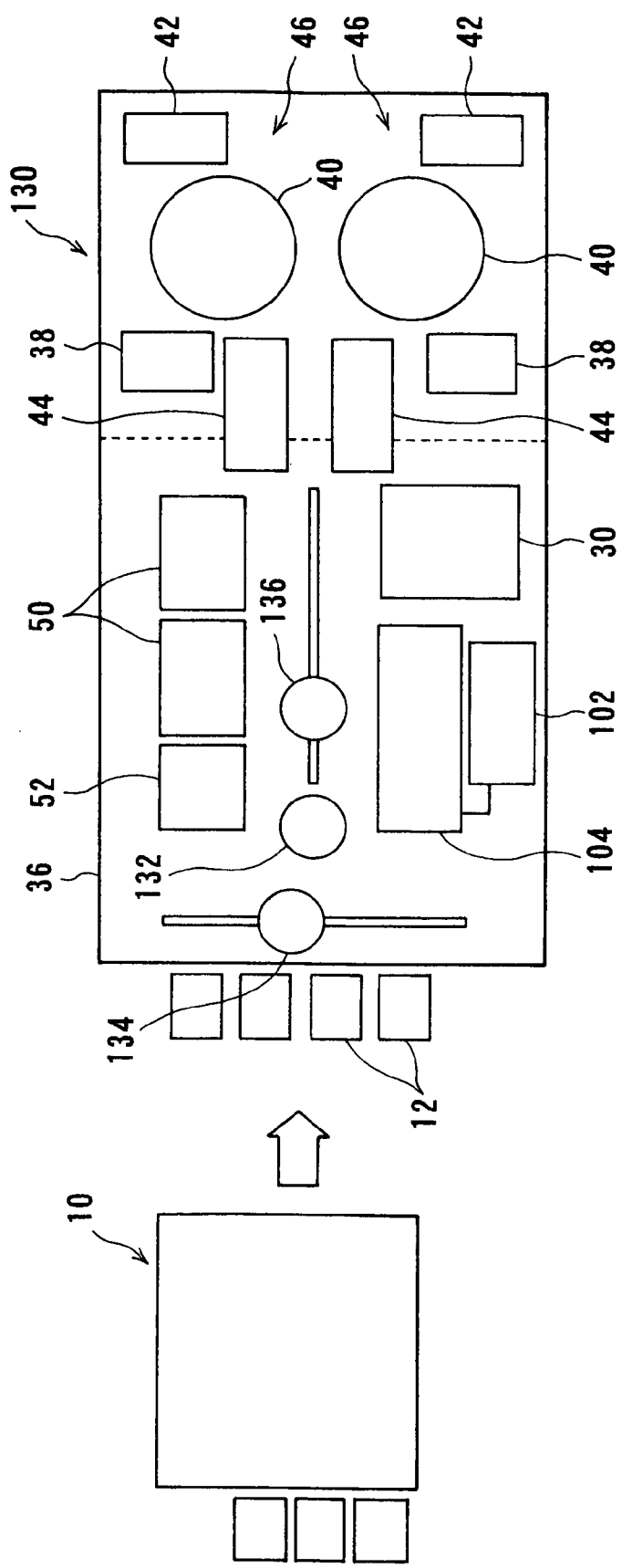
FIG. 14 is a layout plan of a substrate processing apparatus according to yet another embodiment of the present invention, which is suited for performing the first method.

FIG. 14 shows a substrate processing apparatus according to yet another embodiment of the present invention, which is suited for performing the above-described first method. This substrate processing apparatus is comprised of the above-described plating apparatus 10 shown in FIG. 4, and a CMP apparatus 130, which are arranged in series. The CMP apparatus 130 of this embodiment has a similar construction to the CMP apparatus 34 shown in FIG. 6 but additionally includes the annealing unit 30 shown in FIG. 5 and the partial removal unit 104 shown in FIG. 11, for example comprised of a chemical etching unit or an electrolytic etching unit, provided with film thickness measuring section 102 for measuring a thickness of a film. Further, the CMP apparatus 130 employs a stage 132 and two transport robots 134, 136 as transport devices.

Figure 15:
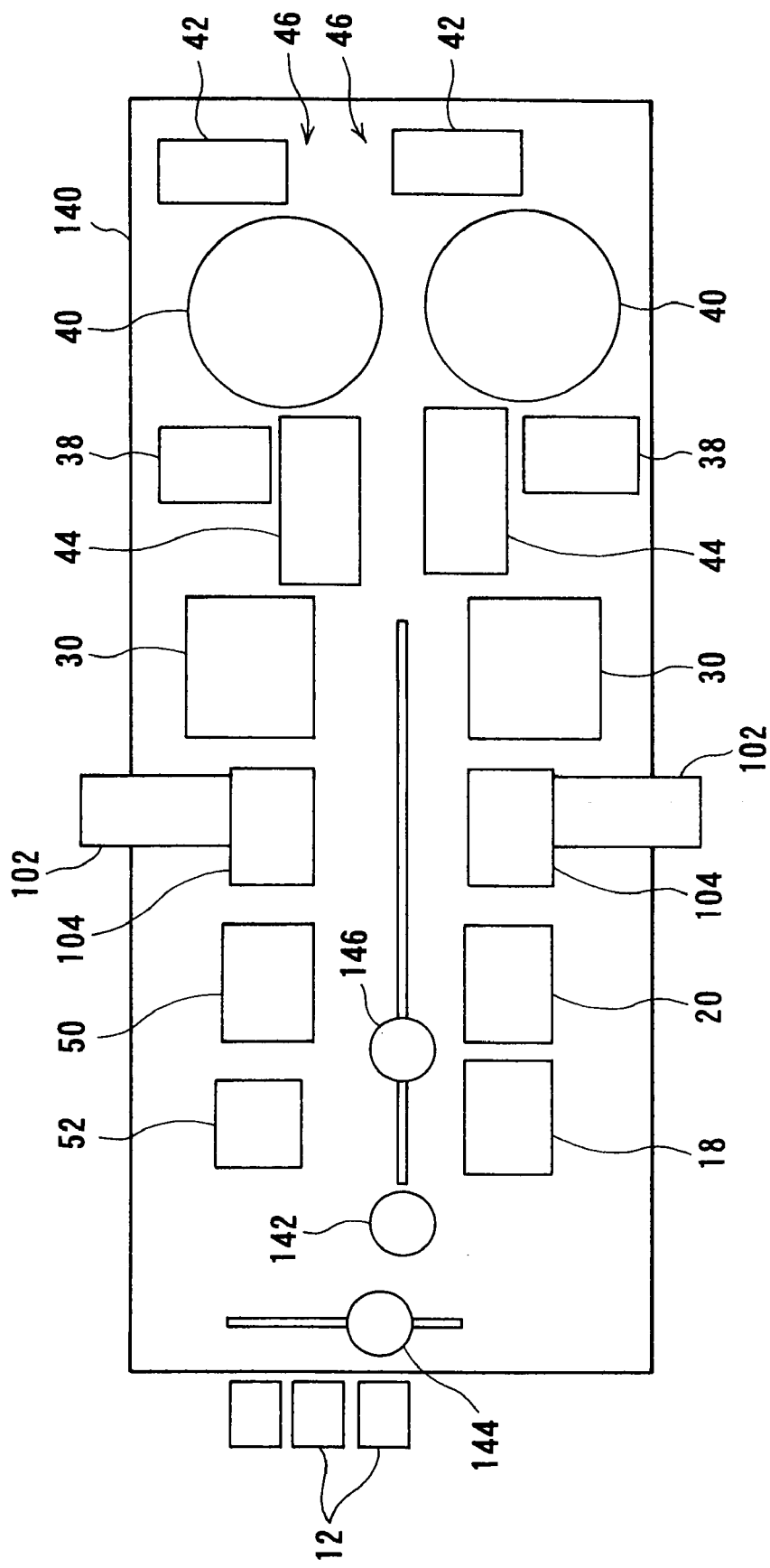
FIG. 15 is a layout plan of a substrate processing apparatus according to yet another embodiment of the present invention, which is suited for performing the first method.

FIG. 15 shows a substrate processing apparatus according to yet another embodiment of the present invention, which is suited for performing the above-described first method. This substrate processing apparatus has a plurality of processing units disposed in a single apparatus frame so that a series of interconnect formation processings as shown in the flow charts of FIGS. 9 and 10 can be performed successively in the single apparatus.

In particular, the substrate processing apparatus includes a rectangular apparatus frame 140 and transport boxes 12, detachably mounted to the apparatus frame 140, each housing substrates, e.g. substrates W having a seed layer 7, shown in FIG. 8A. Inside the apparatus frame 140 are disposed a stage 142, one plating unit 18, one bevel etching/back surface cleaning unit (ineffective region etching unit) 20, two partial removal units (effective region etching units) 104 each provided with film thickness measuring section 102 for measuring a thickness of a film, two annealing units (crystal stabilization units) 30, two CMP units 46, one scrub cleaning unit 50, one cleaning/drying unit 52, and two transport robots 144, 146.

According to the substrate processing apparatus, substrates having a seed layer are carried one by one by the transport robot 144 from the transport box 12 into the apparatus frame 140. A substrate is then subjected to sequential processings of: plating in the plating unit 18; removal, by etching, of e.g. a copper film deposited in an ineffective region of the substrate, followed by cleaning, in the bevel etching/back surface cleaning unit 20; partial removal, by etching, of e.g. a copper film deposited in an effective region of the substrate, followed by cleaning, in one of the two partial removal units 104; metal crystal stabilization processing in one of the two annealing units 30; and CMP in one of the two CMP units 46. The substrate is then scrub-cleaned in the scrub cleaning unit 50, and rinsed (cleaned) with pure water, followed by spin-drying, in the cleaning/drying unit 52. Thereafter, the substrate is returned by the transport robot 144 to an original position in the transport box 12.

Figure 16:
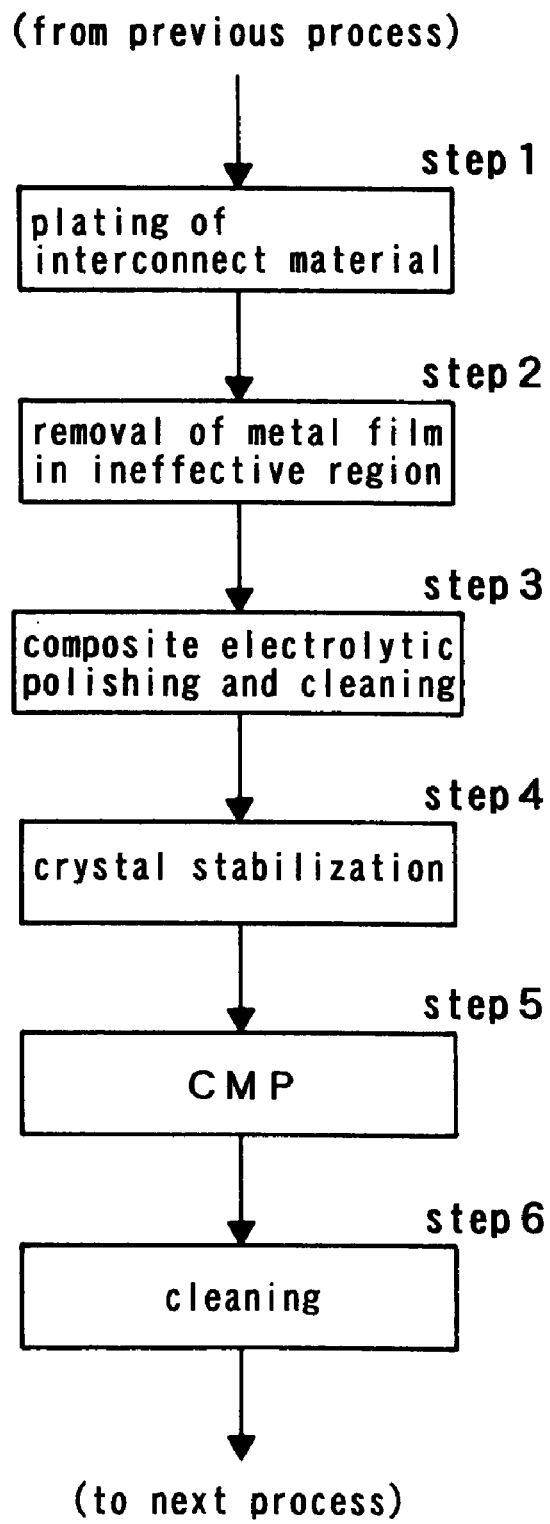
FIG. 16 is a flow chart of a substrate processing method according to another embodiment of the present invention (second method)

FIG. 16 shows a flow chart of a substrate processing method according to another embodiment of the present invention (second method). According to this embodiment, as with the preceding embodiment (first method), substrate W having seed layer 7, shown in FIG. 8A, is first prepared. Then, as shown in FIG. 8B, copper plating of a surface of the substrate W is performed to fill fine holes 3 and interconnect trenches 4 with copper and, at the same time, deposit a copper film 6 on insulating film 2 (step 1). Thereafter, the copper film deposited in an ineffective region, such as an edge (bevel) portion, of the substrate is removed, for example by etching, followed by cleaning and, if necessary, a back surface of the substrate is also cleaned (step 2).

Next, part (surface) of an extra copper film 6 deposited in an effective region, such as a device-formation-region, of the substrate W is removed by composite electrolytic polishing until the copper film 6 becomes thin to a predetermined thickness, as shown in FIG. 8C, followed by cleaning (step 3). As with the first method, during this partial removal processing, a thickness of remaining copper film 6 is measured and this measured thickness is fed back, whereby a removal amount of copper film 6 can be controlled in situ. Further, according to necessity, the substrate W is subjected to annealing (heating) or infrared irradiation to grow and stabilize metal crystals of the copper film 6 (step 4).

Next, the extra copper film 6 having the predetermined thickness, remaining on the insulating film 2 positioned in the effective region of the substrate W, and barrier layer 5 are removed by chemical-mechanical polishing (CMP) so as to make a surface of the copper film 6, filled in the fine holes 3 and the interconnect trenches 4, substantially flush with a surface of the insulating film 2. Interconnects, which are formed of the copper film 6, as shown in FIG. 8D, are thus formed (step 5). Front and back surfaces of the substrate, having the interconnects of copper film 6, are cleaned by using a combined chemical and physical means, for example a combination of a chemical and scrubbing, and rinsed (cleaned) with pure water, followed by spin-drying (step 6). The substrate after drying is then sent to a next process.

Figure 17:
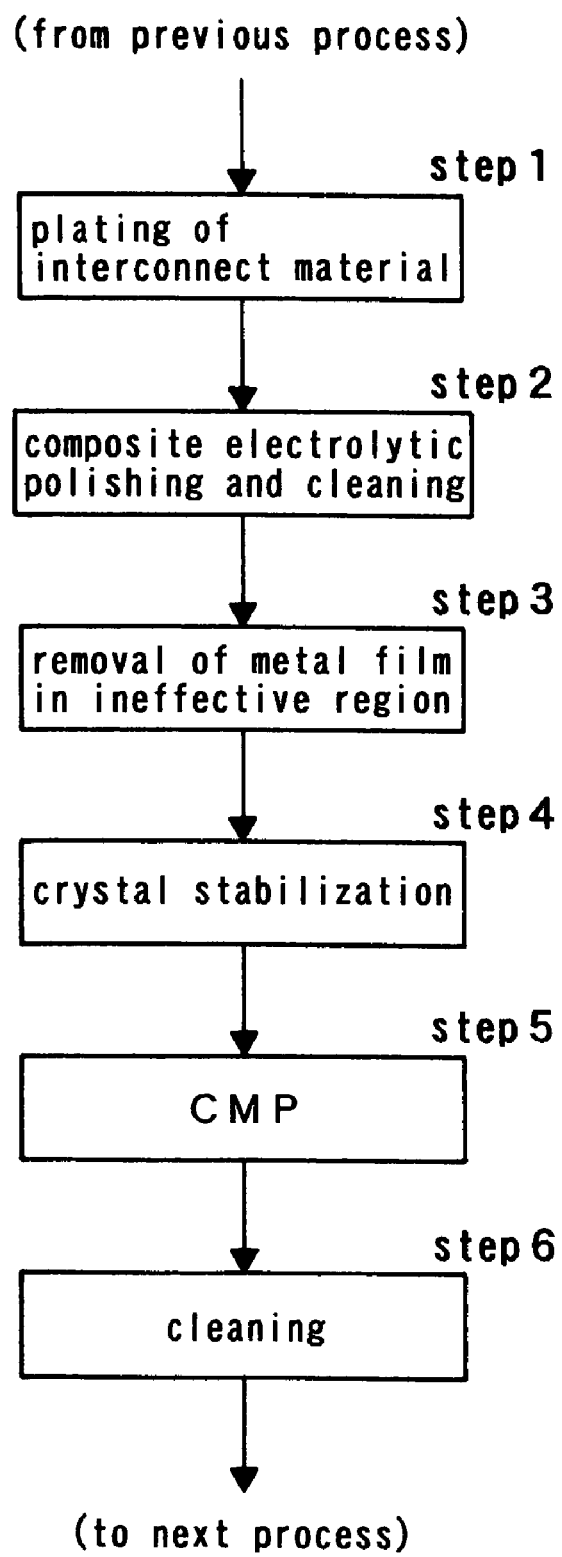
FIG. 17 is a flow chart showing a variation of the second method shown in FIG. 16.

As shown in FIG. 17, it is also possible to first remove, by composite electrolytic polishing, part of the extra copper film 6 deposited in the effective region of the substrate W, i.e. the device-formation-region, followed by cleaning (step 2), and then remove the copper film 6 deposited in the ineffective region of the substrate W, i.e. the edge (bevel) portion, for example by etching, followed by cleaning and, according to necessity, also clean the back surface of the substrate (step 3).

Composite electrolytic polishing is a polishing method which comprises chelation of (complexing) a surface of a metal film in an electrolytic solution to thereby make the metal film surface weak or fragile, and scrub-removing fragile metal film by bringing the metal film into mechanical contact with a contact member. For chelating of metal film, a chelating agent is added to the electrolytic solution. The electrolytic solution may be exemplified by an electrolytic solution containing an electrolyte, such as copper sulfate or ammonium sulfate. It is possible to add abrasive grains or a slurry to the electrolytic solution to enhance a mechanical polishing action. According to the present invention, electrolytic polishing may also be employed. Electrolytic polishing is a method which comprises interposing an ion exchanger between an electrode and a substrate, bringing the ion exchanger close to or into contact with the substrate, and applying a voltage between the electrode and the substrate while supplying pure water or ultrapure water, a liquid comprising pure water or pure water and an additive, such as a surfactant, and having an electric conductivity of not more than 500 $\mu$S/cm, preferably not more than 50 $\mu$S/cm, most preferably not more than 0.1 $\mu$S/cm, or an electrolytic solution between the electrode and the substrate.

Figure 18:
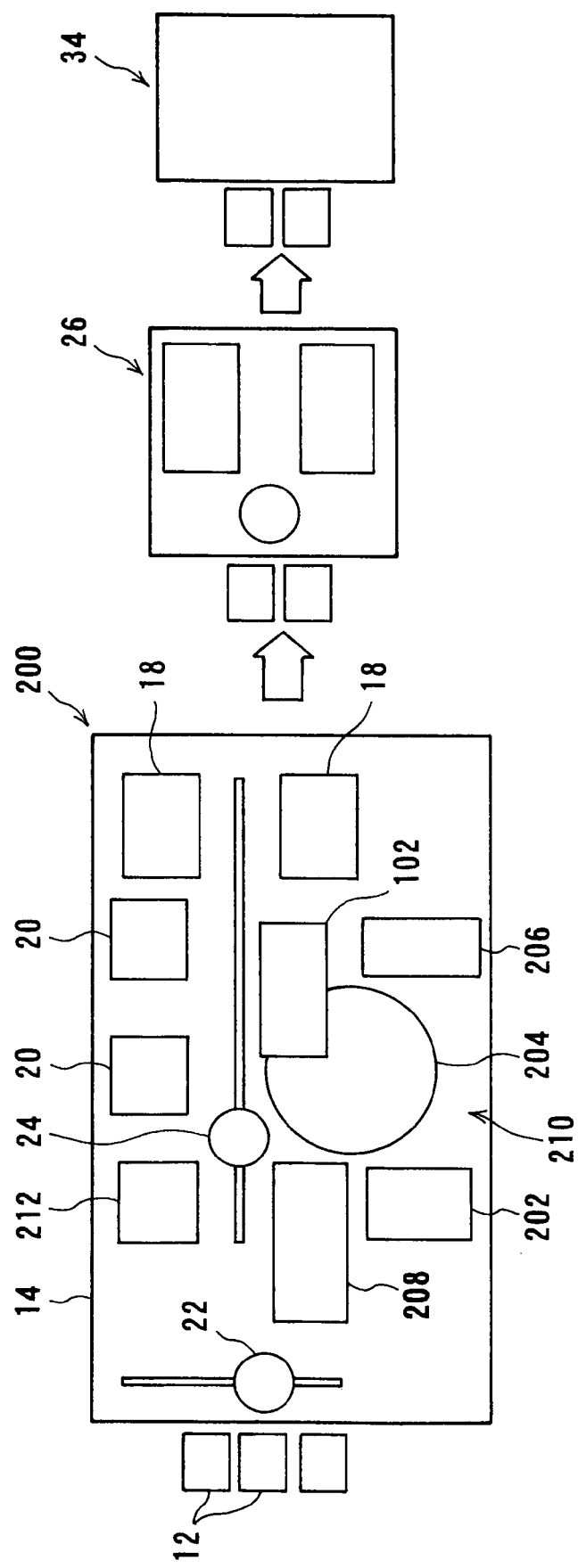
FIG. 18 is a layout plan of a substrate processing apparatus according to yet another embodiment of the present invention, which is suited for performing the second method.

FIG. 18 shows a substrate processing apparatus according to yet another embodiment of the present invention, which is suited for performing the above-described second method. This substrate processing apparatus is comprised of a plating apparatus 200, the above-described annealing apparatus 26 shown in FIG. 5, and the above-described CMP apparatus 34 shown in FIG. 6, which are arranged in series. The plating apparatus 200 of this embodiment has a similar construction to the plating apparatus 10 shown in FIG. 4 but additionally includes a composite electrolytic polishing unit 210 and a cleaning/drying unit 212. The composite electrolytic polishing unit 210 includes a top ring 202, a turntable (polishing table) 204, a dresser 206 and a loader 208, and electrolytically polishes a substrate by pressing the substrate held by the top ring 202 against a polishing surface (upper surface) of the turntable 204 while moving the substrate and the turntable 204 relative to each other. The composite electrolytic polishing unit 210 is provided with the above-described film thickness measuring section 102 for measuring a thickness of a film. A step (step 3) of removing part (surface) of extra copper film 6 deposited in an effective region of substrate W, followed by cleaning, is performed by the composite electrolytic polishing unit 210, and a thickness of remaining copper film 6 is measured, during this removal processing, by the film thickness measuring section 102 and a measured thickness is fed back so as to control the composite electrolytic polishing unit 210.

Figure 19:
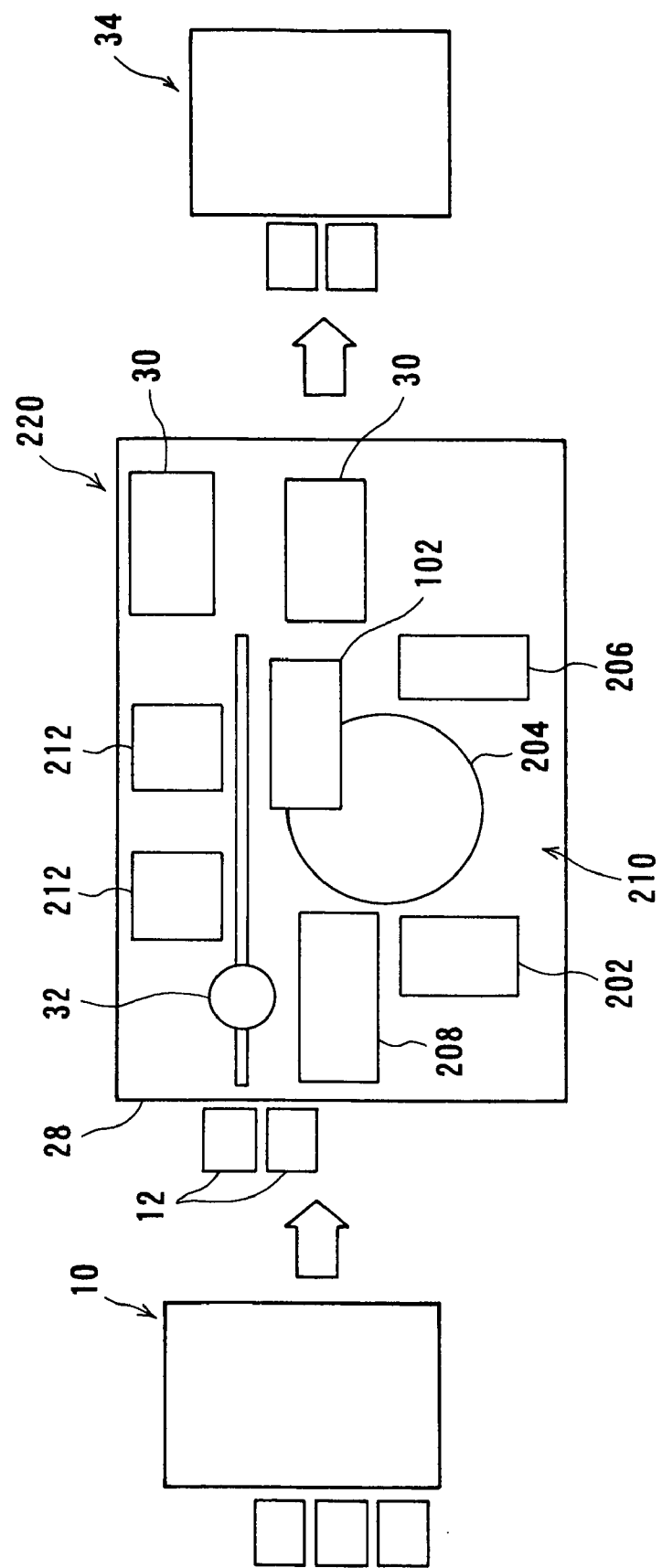
FIG. 19 is a layout plan of a substrate processing apparatus according to yet another embodiment of the present invention, which is suited for performing the second method.

FIG. 19 shows a substrate processing apparatus according to yet another embodiment of the present invention, which is suited for performing the above-described second method. This substrate processing apparatus is comprised of the above-described plating apparatus 10 shown in FIG. 4, an annealing apparatus 220, and the above-described CMP apparatus 34 shown in FIG. 6, which are arranged in series. The annealing apparatus 220 of this embodiment has a similar construction to the annealing apparatus 26 shown in FIG. 5 but additionally includes the composite electrolytic polishing unit 210 shown in FIG. 18, provided with film thickness measuring section 102 for measuring a thickness of a film, and two cleaning/drying units 212.

Figure 20:
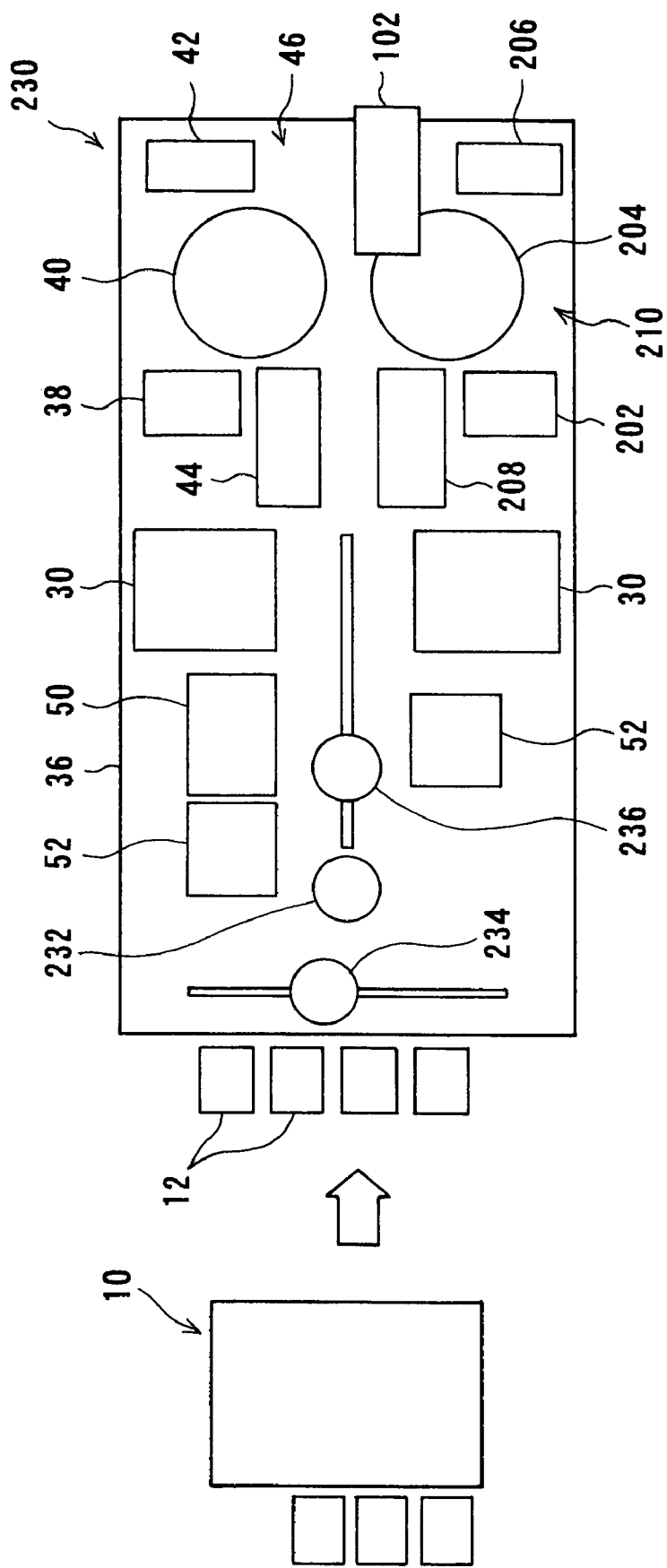
FIG. 20 is a layout plan of a substrate processing apparatus according to yet another embodiment of the present invention, which is suited for performing the second method.

FIG. 20 shows a substrate processing apparatus according to yet another embodiment of the present invention, which is suited for performing the above-described second method. This substrate processing apparatus is comprised of the above-described plating apparatus 10 shown in FIG. 4, and a CMP apparatus 230, which are arranged in series. The CMP apparatus 230 of this embodiment has a similar construction to the CMP apparatus 34 shown in FIG. 6 but employs, in place of one of the CMP units 46, the composite electrolytic polishing unit 210 shown in FIG. 18, provided with film thickness measuring section 102 for measuring a thickness of a film, and additionally includes two annealing units 30. Further, the CMP apparatus 230 employs a stage 232 and two transport robots 234, 236 as transport devices.

Figure 21:
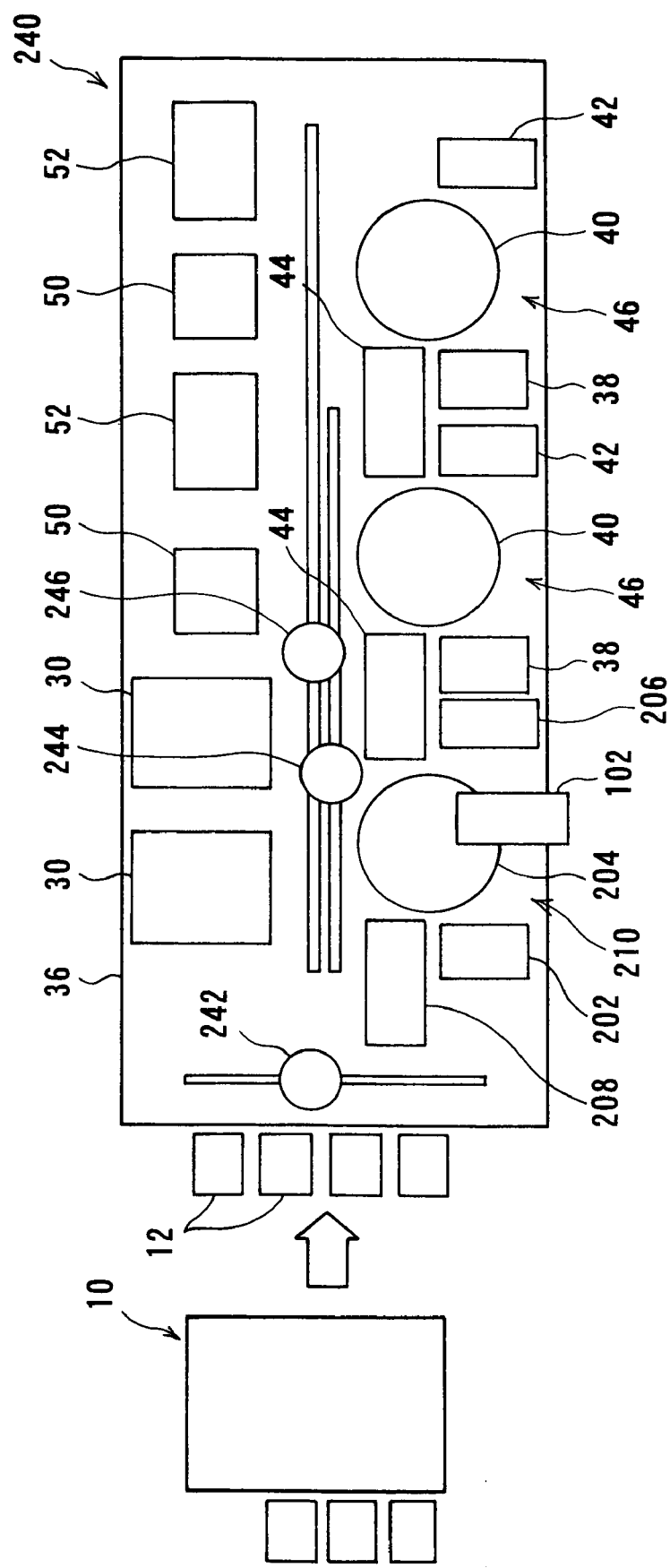
FIG. 21 is a layout plan of a substrate processing apparatus according to yet another embodiment of the present invention, which is suited for performing the second method.

FIG. 21 shows a substrate processing apparatus according to yet another embodiment of the present invention, which is suited for performing the above-described second method. This substrate processing apparatus is comprised of the above-described plating apparatus 10 shown in FIG. 4, and a CMP apparatus 240, which are arranged in series. The CMP apparatus 240 of this embodiment has a similar construction to the CMP apparatus 230 shown in FIG. 20 but employs two CMP units 46 and three transport robots 242, 244, 246 as transport devices.

Figure 22:
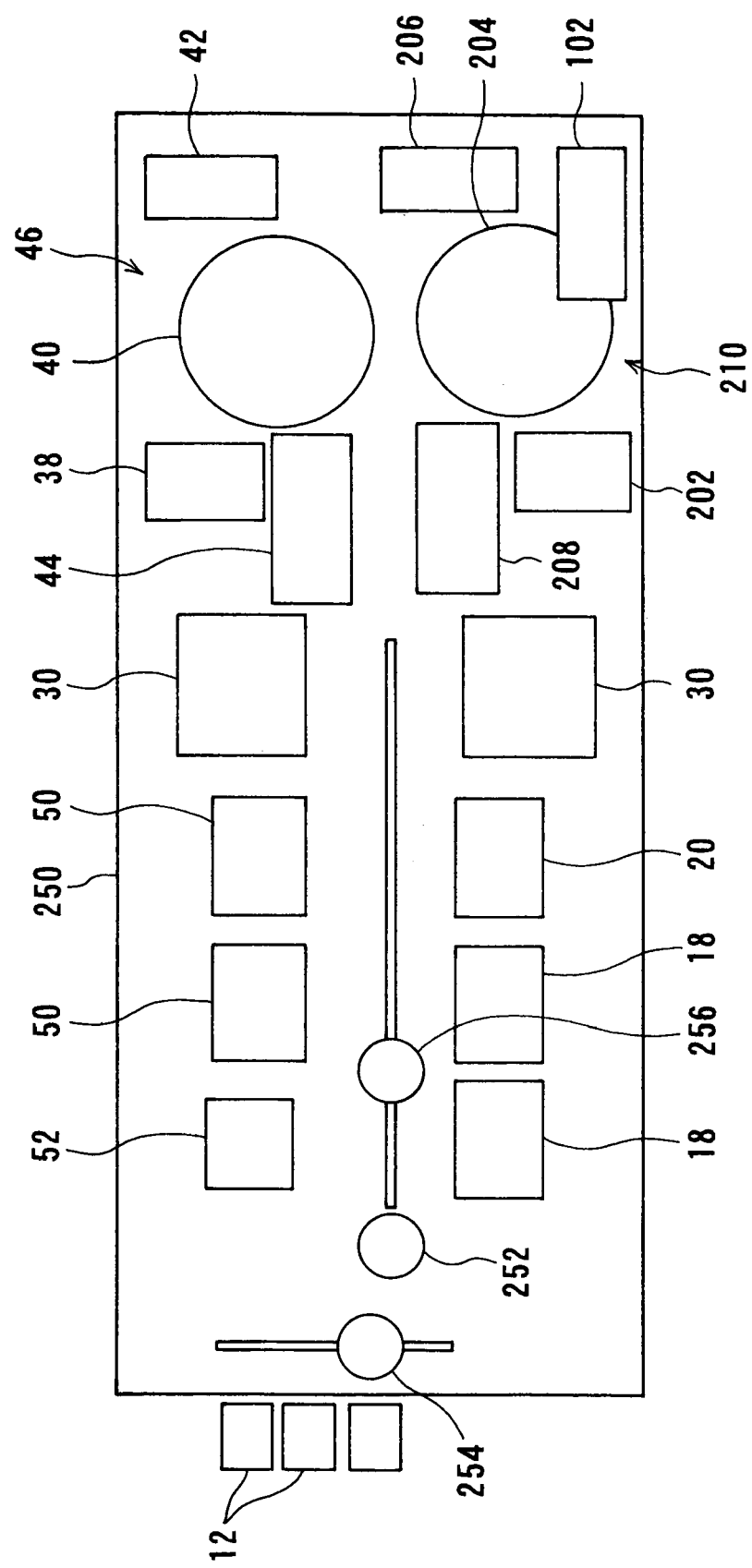
FIG. 22 is a layout plan of a substrate processing apparatus according to yet another embodiment of the present invention, which is suited for performing the second method.

FIG. 22 shows a substrate processing apparatus according to yet another embodiment of the present invention, which is suited for performing the above-described second method. This substrate processing apparatus has a plurality of processing units disposed in a single apparatus frame so that a series of interconnect formation processings as shown in the flow charts of FIGS. 16 and 17 can be performed successively in the single apparatus.

In particular, the substrate processing apparatus includes a rectangular apparatus frame 250 and transport boxes 12, detachably mounted to the apparatus frame 250, each housing substrates, e.g. substrates W having a seed layer 7, shown in FIG. 8A. Inside the apparatus frame 250 are disposed a stage 252, two plating units 18, one bevel etching/back surface cleaning unit (ineffective region etching unit) 20, one composite electrolytic polishing unit 210 provided with film thickness measuring section 102, two annealing units (crystal stabilization units) 30, one CMP unit 46, two scrub cleaning units 50, one cleaning/drying unit 52, and two transport robots 254, 256.

According to the substrate processing apparatus, substrates having a seed layer are carried one by one by the transport robot 254 from a corresponding transport box 12 into the apparatus frame 250. Each substrate is then subjected to sequential processings of: plating in one of the two plating units 18; removal, by etching, of e.g. a copper film deposited in an ineffective region of the substrate, followed by cleaning, in the bevel etching/back surface cleaning unit 20; partial removal, by etching, of e.g. a copper film deposited in an effective region of the substrate, followed by cleaning, in the composite electrolytic polishing unit 210; metal crystal stabilization processing in one of the two annealing units 30; and CMP in the CMP unit 46. The substrate is then scrub-cleaned in one of the two scrub cleaning units 50, and rinsed (cleaned) with pure water, followed by spin-drying, in the cleaning/drying unit 52. Thereafter, the substrate is returned by the transport robot 254 to an original position in the transport box 12.

Figure 23:
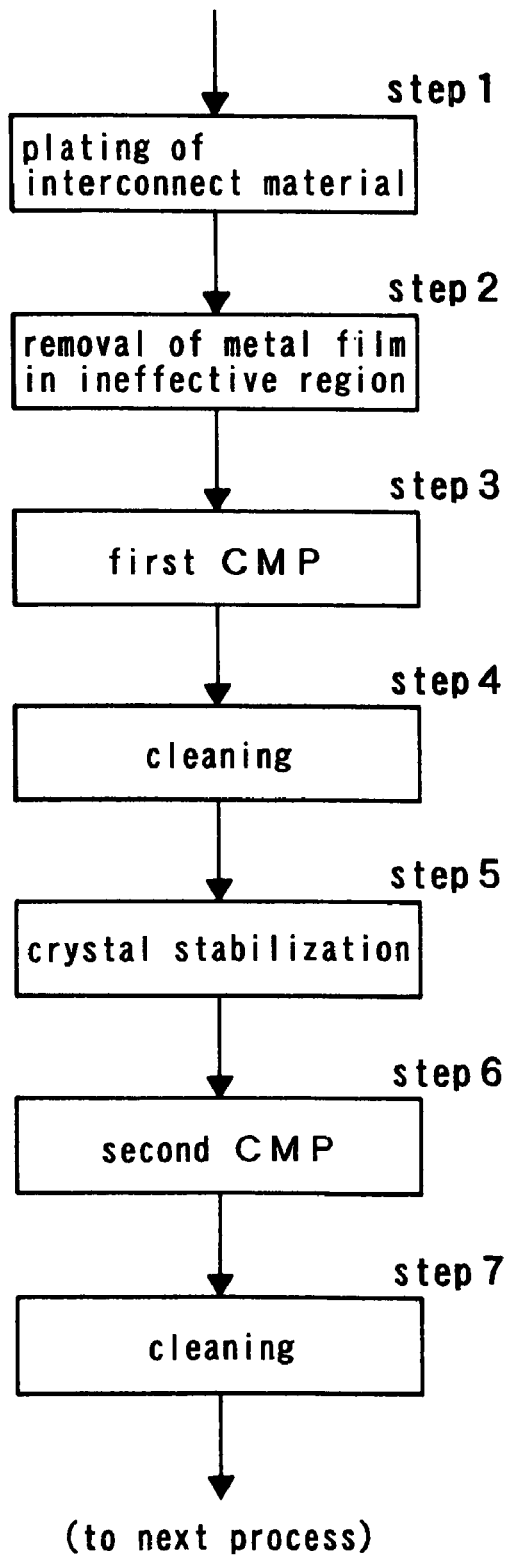
FIG. 23 is a flow chart of a substrate processing method according to yet another embodiment of the present invention (third method)

FIG. 23 shows a flow chart of a substrate processing method according to yet another embodiment of the present invention (third method). According to this embodiment, as with the preceding embodiments (first and second methods), substrate W having seed layer 7, shown in FIG. 8A, is first prepared. Then, as shown in FIG. 8B, copper plating of a surface of the substrate W is performed to fill fine holes 3 and interconnect trenches 4 with copper and, at the same time, deposit a copper film 6 on insulating film 2 (step 1). Thereafter, the copper film deposited in an ineffective region, such as an edge (bevel) portion, of the substrate W is removed, for example by etching, followed by cleaning and, if necessary, a back surface of the substrate is also cleaned (step 2).

Next, part (surface) of an extra copper film 6 deposited in an effective region, such as the device-formation-region, of the substrate W is removed by performing a primary CMP (first CMP) until the copper film 6 becomes thin to a predetermined thickness (step 3), as shown in FIG. 8C, followed by cleaning (step 4). As with the first and second methods, during this partial removal processing, a thickness of remaining copper film 6 is measured and this measured thickness is fed back, whereby a removal amount of copper film 6 can be controlled in situ. Further, according to necessity, the substrate W is subjected to annealing (heating) or infrared irradiation to grow and stabilize metal crystals of the copper film 6 (step 5). The primary CMP may be one that employs a so-called fixed abrasive method. Depending upon a purpose, instead of CMP, partial removal of the metal film may be performed by so-called grinding.

Next, extra copper film 6 having the predetermined thickness, remaining on the insulating film 2 positioned in the effective region of the substrate W, and barrier layer 5 are removed by performing a secondary chemical-mechanical polishing (second CMP) so as to make a surface of the copper film 6, filled in the fine holes 3 and the interconnect trenches 4, substantially flush with a surface of the insulating film 2. Interconnects, which are formed of the copper film 6, as shown in FIG. 8D, are thus formed (step 6). Front and back surfaces of the substrate, having the interconnects of copper film 6, are cleaned by using a combined chemical and physical means, for example a combination of a chemical and scrubbing, and rinsed (cleaned) with pure water, followed by spin-drying (step 7). The substrate after drying is then sent to a next process.

Figure 24:
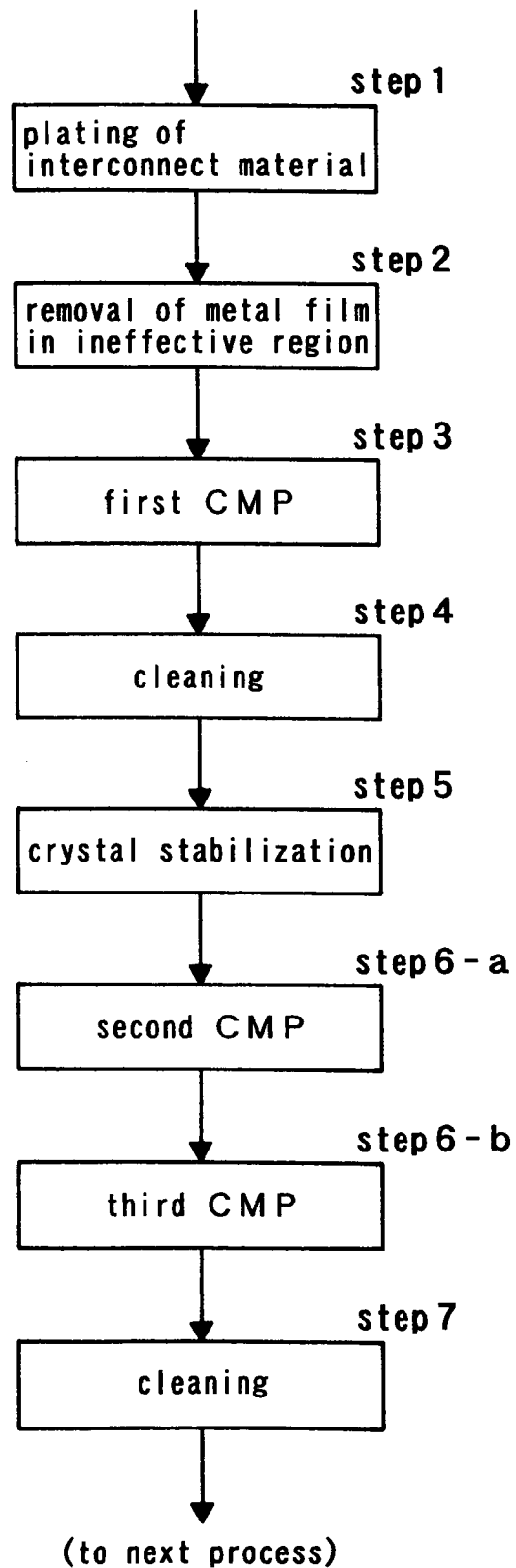
FIG. 24 is a flow chart showing a variation of the third method shown in FIG. 23.

As shown in FIG. 24, it is also possible to perform the secondary chemical-mechanical polishing in two steps: step 6-*a* of performing CMP (second CMP) for primarily polishing e.g. the copper film; and step 6-*b* of performing CMP (third CMP) for primarily polishing e.g. the barrier layer.

Figure 25:
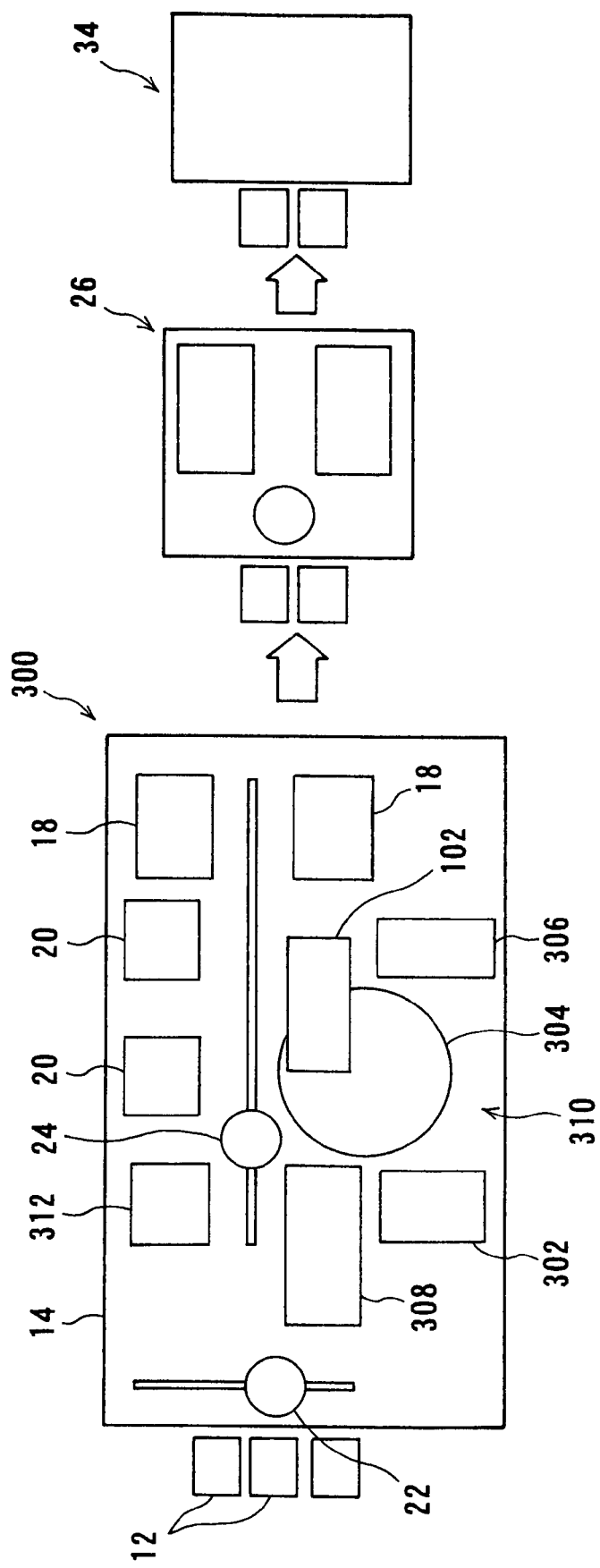
FIG. 25 is a layout plan of a substrate processing apparatus according to yet another embodiment of the present invention, which is suited for performing the third method.

FIG. 25 shows a substrate processing apparatus according to yet another embodiment of the present invention, which is suited for performing the above-described third method. This substrate processing apparatus is comprised of a plating apparatus 300, the above-described annealing apparatus 26 shown in FIG. 5, and the above-described CMP apparatus 34 shown in FIG. 6, which are arranged in series. The plating apparatus 300 of this embodiment has a similar construction to the plating apparatus 10 shown in FIG. 4 but additionally includes a first CMP unit 310 and a cleaning/drying unit 312. The first CMP unit 310 includes a top ring 302, a turntable (polishing table) 304, a dresser 306 and a loader 308, and performs CMP of a substrate by pressing the substrate held by the top ring 302 against a polishing surface (upper surface) of the turntable 304 while moving the substrate and the turntable 304 relative to each other. The first CMP unit 310 is provided with the above-described film thickness measuring section 102 for measuring a thickness of a film. The first CMP step (step 3) of removing part (surface) of extra copper film 6 deposited in an effective region of the substrate W, is performed by the first CMP unit 310, and a thickness of remaining copper film 6 is measured during this removal processing, by the film thickness measuring section 102, and this measured thickness is fed back so as to control the first CMP unit 310.

Figure 26:
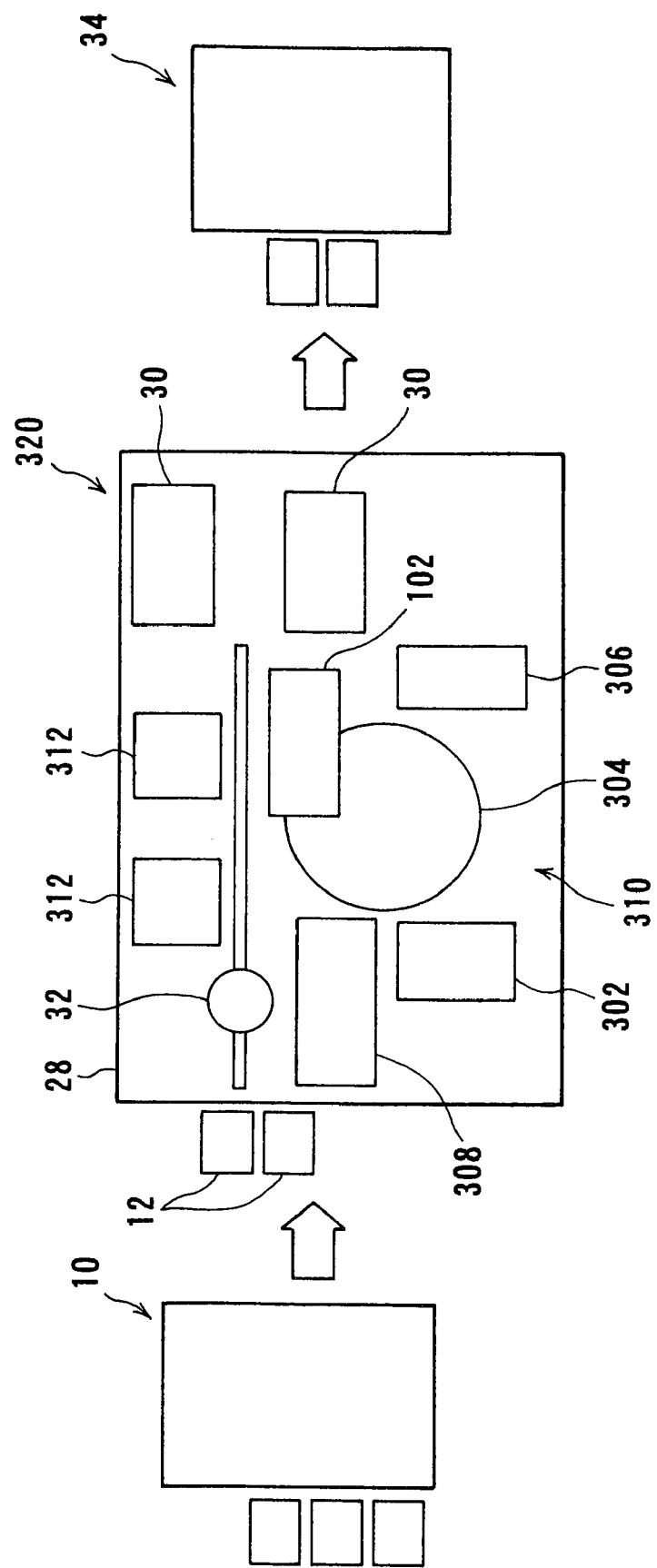
FIG. 26 is a layout plan of a substrate processing apparatus according to yet another embodiment of the present invention, which is suited for performing the third method.

FIG. 26 shows a substrate processing apparatus according to yet another embodiment of the present invention, which is suited for performing the above-described third method. This substrate processing apparatus is comprised of the above-described plating apparatus 10 shown in FIG. 4, an annealing apparatus 320, and the above-described CMP apparatus 34 shown in FIG. 6, which are arranged in series. The annealing apparatus 320 of this embodiment has a similar construction to the annealing apparatus 26 shown in FIG. 5 but additionally includes the first CMP unit 310 shown in FIG. 25, provided with film thickness measuring section 102 for measuring a thickness of a film, and two cleaning/drying units 312.

Figure 27:
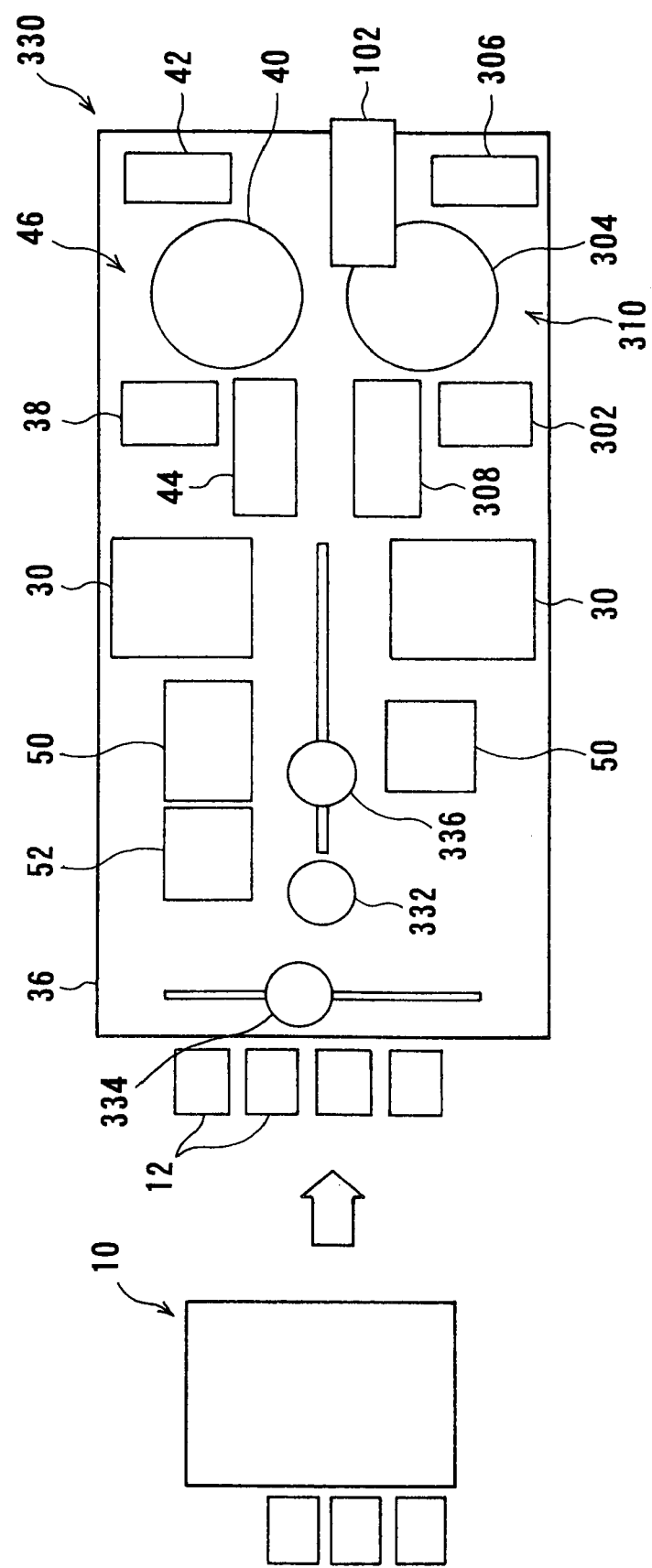
FIG. 27 is a layout plan of a substrate processing apparatus according to yet another embodiment of the present invention, which is suited for performing the third method.

FIG. 27 shows a substrate processing apparatus according to yet another embodiment of the present invention, which is suited for performing the above-described third method. This substrate processing apparatus is comprised of the above-described plating apparatus 10 shown in FIG. 4, and a CMP apparatus 330, which are arranged in series. The CMP apparatus 330 of this embodiment has a similar construction to the CMP apparatus 34 shown in FIG. 6 but employs, in place of one of the CMP units 46, the first CMP unit 310 shown in FIG. 25, provided with film thickness measuring section 102 for measuring a thickness of a film, and additionally includes two annealing units 30. Further, the CMP apparatus 330 employs a stage 332 and two transport robots 334, 336 as transport devices.

Remaining CMP unit 46 performs a secondary CMP (second CMP) of removing extra copper film 6 having a predetermined thickness, remaining on insulating film 2 positioned in an effective region of the substrate W, and barrier layer 5 so as to make a surface of the copper film 6, filled in fine holes 3 and interconnect trenches 4, substantially flush with a surface of the insulating film 2.

Figure 28:
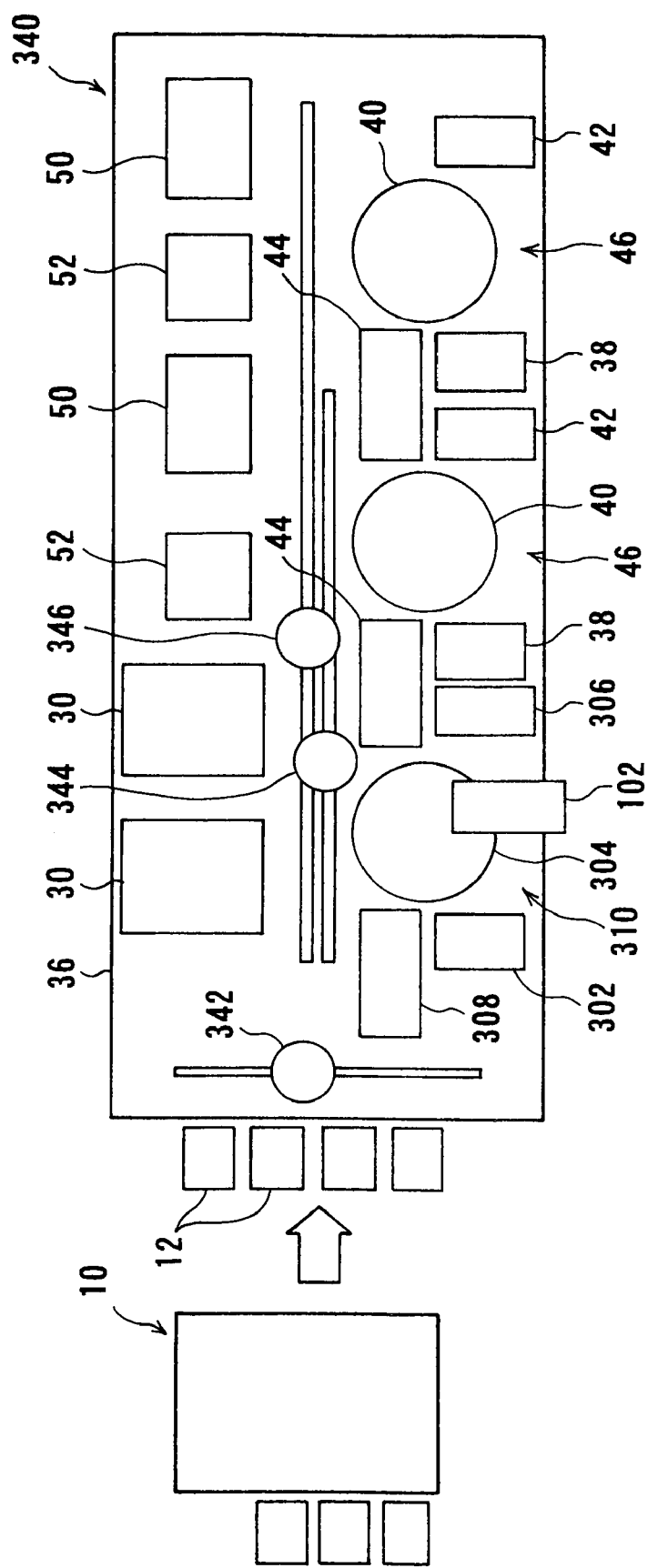
FIG. 28 is a layout plan of a substrate processing apparatus according to yet another embodiment of the present invention, which is suited for performing the third method.

FIG. 28 shows a substrate processing apparatus according to yet another embodiment of the present invention, which is suited for performing the above-described third method. This substrate processing apparatus is comprised of the above-described plating apparatus 10 shown in FIG. 4, and a CMP apparatus 340, which are arranged in series. The CMP apparatus 340 of this embodiment has a similar construction to the CMP apparatus 330 shown in FIG. 27 but employs two CMP units 46 so that secondary CMP can be performed in two steps, i.e. a step of performing CMP (second CMP) for primarily polishing e.g. a copper film, and a step of performing CMP (third CMP) for primarily polishing e.g. a barrier layer, which steps are performed separately in the two CMP units 46, and three transport robots 342, 344, 346 as transport devices.

Figure 29:
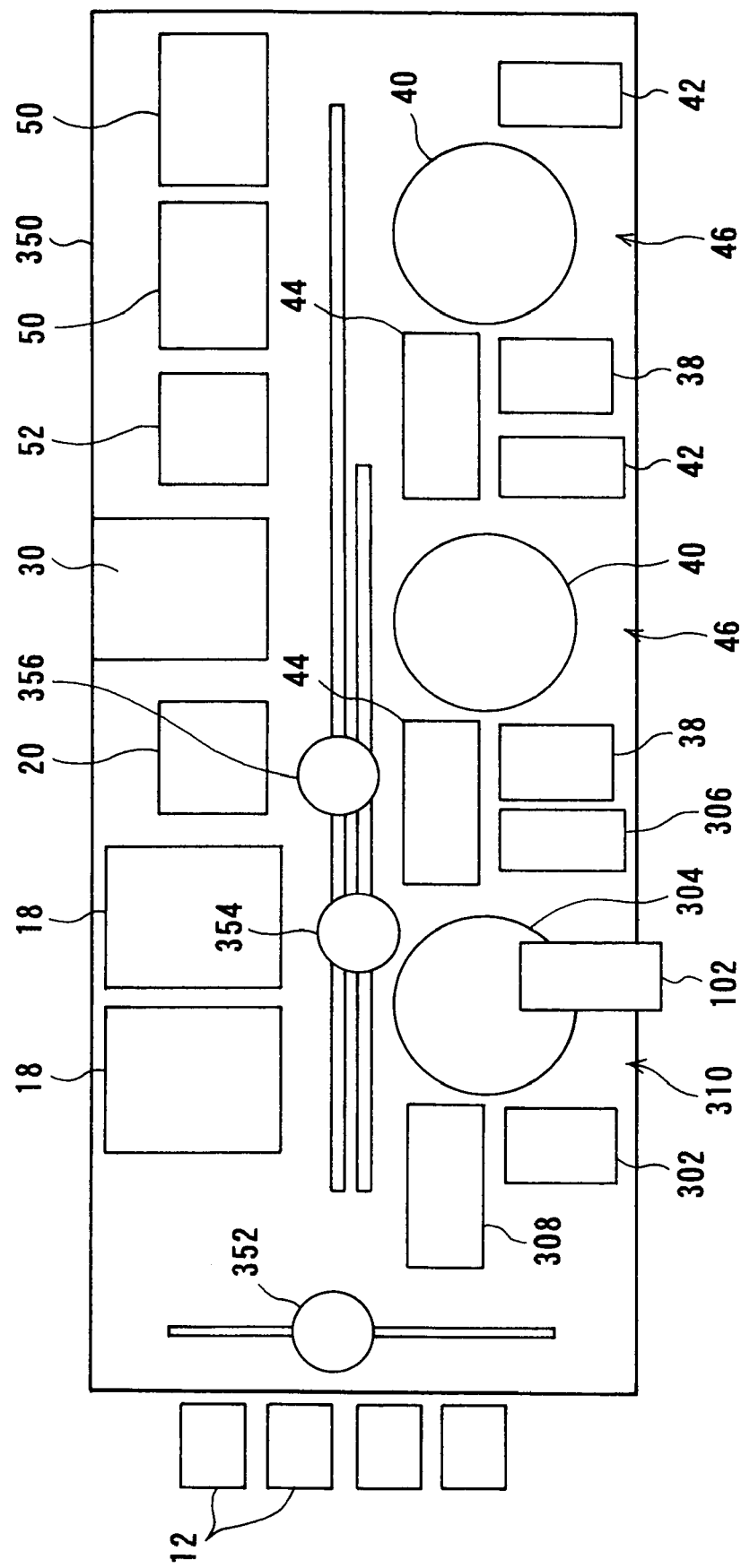
FIG. 29 is a layout plan of a substrate processing apparatus according to yet another embodiment of the present invention, which is suited for performing the third method.

FIG. 29 shows a substrate processing apparatus according to yet another embodiment of the present invention, which is suited for performing the above-described third method. This substrate processing apparatus has a plurality of processing units disposed in a single apparatus frame so that a series of interconnect formation processings as shown in the flow charts of FIGS. 23 and 24 can be performed successively in the single apparatus.

In particular, the substrate processing apparatus includes a rectangular apparatus frame 350 and transport boxes 12 detachably mounted to the apparatus frame 350, each housing substrates, e.g. substrates W having a seed layer 7, shown in FIG. 8A. Inside the apparatus frame 350 are disposed two plating units 18, one bevel etching/back surface cleaning unit (ineffective region etching unit) 20, one first CMP unit 310, provided with film thickness measuring section 102, for performing primary CMP (first CMP), one annealing unit (crystal stabilization units) 30, two CMP units 46 for performing secondary CMP (second CMP, or a second CMP and a third CMP), two scrub cleaning units 50, one cleaning/drying unit 52, and three transport robots 352, 354, 356.

According to the substrate processing apparatus, substrates having a seed layer are carried one by one by the transport robot 352 from a corresponding transport box 12 into the apparatus frame 350. Each substrate is then subjected to sequential processings of: plating in one of the two plating units 18; removal, by etching, of e.g. a copper film deposited in an ineffective region of the substrate, followed by cleaning, in the bevel etching/back surface cleaning unit 20; primary CMP in the first CMP unit 310; metal crystal stabilization processing in the annealing unit 30; and secondary CMP in the CMP units 46. The substrate is then scrub-cleaned in one of the two scrub cleaning units 50, and rinsed (cleaned) with pure water, followed by spin-drying, in the cleaning/drying unit 52. Thereafter, the substrate is returned by the transport robot 352 to an original position in the transport box 12.

As described hereinabove, according to the present invention, in advance of a chemical-mechanical polishing step which is likely to cause damage to a substrate, a metal film formed in excess on the substrate is made thin. This prevents peel-off or separation of an interlayer dielectric and (copper) interconnects even when a material having a low mechanical strength is employed for the interlayer dielectric, thereby enabling a higher-yield production of a semiconductor device having a multi-layer interconnect structure of fine interconnects. Further, the present invention, through effective utilization of existing plating apparatus, chemical-mechanical polishing apparatus, and the like, enables smooth operation of a mass production factory that uses a next-generation new material.

Although certain preferred embodiments of the present invention have been shown and described in detail, it should be understood that various changes and modifications may be made therein without departing from the scope of the appended claims.

What is claimed is:

1. A substrate processing method comprising:
    providing a substrate having an interlayer dielectric including a low-k material on said substrate, with interconnect recesses being formed in a surface of said interlayer dielectric, said substrate further having a barrier layer on said surface of said interlayer dielectric, and a metal film embedded in said interconnect recesses and formed on said barrier layer;
    removing part of an extra portion of said metal film formed in an effective region of said substrate; then
    subjecting said substrate to crystal stabilization processing so as to stabilize metal crystals of said metal film remaining on said barrier layer; and then
    chemical-mechanical polishing said substrate to remove a remaining part of said extra portion of said metal film along with said barrier layer, thereby flattening said surface of said interlayer dielectric.

2. The substrate processing method according to claim 1, further comprising:
    measuring a thickness of a remaining portion of said metal film so as to control a removal amount of said part of said extra portion of said metal film from said effective region of said substrate.

3. The substrate processing method according to claim 2, further comprising:
    removing said metal film from an edge portion of said substrate.

4. The substrate processing method according to claim 1, further comprising:
    removing said metal film from an edge portion of said substrate.

5. The substrate processing method according to claim 1, wherein
    removing part of an extra portion of said metal film formed in an effective region of said substrate comprises etching said part of said extra portion of said metal film.

6. The substrate processing method according to claim 5, further comprising:
    measuring a thickness of a remaining portion of said metal film so as to control a removal amount of said part of said extra portion of said metal film from said effective region of said substrate.

7. The substrate processing method according to claim 6, further comprising:
    removing said metal film from an edge portion of said substrate.

8. The substrate processing method according to claim 5, further comprising:
    removing said metal film from an edge portion of said substrate.

* * * * *